(12) United States Patent
Lubomirsky et al.

(10) Patent No.: US 10,096,496 B2
(45) Date of Patent: Oct. 9, 2018

(54) PROCESS CHAMBER FOR ETCHING LOW K AND OTHER DIELECTRIC FILMS

(71) Applicant: Applied Materials, Inc., Santa Clara, CA (US)

(72) Inventors: Dmitry Lubomirsky, Cupertino, CA (US); Srinivas Nemani, Sunnyvale, CA (US); Ellie Yieh, San Jose, CA (US); Sergey G. Belostotskiy, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/495,832

(22) Filed: Apr. 24, 2017

(65) Prior Publication Data

US 2017/0229325 A1     Aug. 10, 2017

Related U.S. Application Data

(62) Division of application No. 13/651,074, filed on Oct. 12, 2012, now Pat. No. 9,666,414.

(Continued)

(51) Int. Cl.
*H01L 21/76* (2006.01)
*H01L 21/67* (2006.01)
(Continued)

(52) U.S. Cl.
CPC .... *H01L 21/67069* (2013.01); *C23C 16/0245* (2013.01); *H01J 37/32091* (2013.01);
(Continued)

(58) Field of Classification Search
CPC ............. H01J 2237/3341; C23C 16/0245
See application file for complete search history.

(56) References Cited

U.S. PATENT DOCUMENTS

| 4,889,588 A | * | 12/1989 | Fior ................ H01J 37/32082 |
| | | | 156/345.45 |
| 5,705,443 A | * | 1/1998 | Stauf ....................... C23F 4/00 |
| | | | 204/192.35 |

(Continued)

FOREIGN PATENT DOCUMENTS

| CN | 1300524 A | 5/1999 |
| JP | 2003-129821 | 6/1991 |

(Continued)

OTHER PUBLICATIONS

Notice of Office Action from Japanese Patent Application No. 2014-538839 dated Sep. 26, 2017, 3 pgs.

(Continued)

*Primary Examiner* — Jason Berman
(74) *Attorney, Agent, or Firm* — Schwabe, Williamson & Wyatt, P.C.

(57) ABSTRACT

Methods and process chambers for etching of low-k and other dielectric films are described. For example, a method includes modifying portions of the low-k dielectric layer with a plasma process. The modified portions of the low-k dielectric layer are etched selectively over a mask layer and unmodified portions of the low-k dielectric layer. Etch chambers having multiple chamber regions for alternately generating distinct plasmas are described. In embodiments, a first charge coupled plasma source is provided to generate an ion flux to a workpiece in one operational mode, while a secondary plasma source is provided to provide reactive species flux without significant ion flux to the workpiece in another operational mode. A controller operates to cycle the operational modes repeatedly over time to remove a desired cumulative amount of the dielectric material.

18 Claims, 18 Drawing Sheets

Related U.S. Application Data

(60) Provisional application No. 61/552,183, filed on Oct. 27, 2011.

(51) Int. Cl.

| | | |
|---|---|---|
| *H01L 21/3065* | (2006.01) | |
| *H01J 37/32* | (2006.01) | |
| *C23C 16/02* | (2006.01) | |
| *H01L 21/3105* | (2006.01) | |
| *H01L 21/311* | (2006.01) | |
| *H01L 21/683* | (2006.01) | |
| *H01L 21/02* | (2006.01) | |

(52) U.S. Cl.
CPC .. *H01J 37/32357* (2013.01); *H01J 37/32477* (2013.01); *H01J 37/32532* (2013.01); *H01J 37/32587* (2013.01); *H01J 37/32715* (2013.01); *H01L 21/3065* (2013.01); *H01L 21/3105* (2013.01); *H01L 21/31116* (2013.01); *H01L 21/31144* (2013.01); *H01L 21/67167* (2013.01); *H01L 21/67207* (2013.01); *H01L 21/6831* (2013.01); *H01J 2237/3341* (2013.01); *H01L 21/02126* (2013.01)

(56) References Cited

U.S. PATENT DOCUMENTS

| | | | |
|---|---|---|---|
| 5,882,414 A | 3/1999 | Fong et al. | |
| 5,895,549 A | 4/1999 | Goto et al. | |
| 6,042,686 A | 3/2000 | Dible et al. | |
| 6,042,826 A | 3/2000 | Caligiuri et al. | |
| 6,455,417 B1 * | 9/2002 | Bao | H01L 21/02126 257/E21.277 |
| 6,863,020 B2 | 3/2005 | Mitrovic et al. | |
| 6,884,635 B2 | 4/2005 | Parsons | |
| 2002/0177321 A1 | 11/2002 | Li | |
| 2003/0079983 A1 | 5/2003 | Long et al. | |
| 2004/0007467 A1 | 1/2004 | McHugh et al. | |
| 2005/0078953 A1 | 4/2005 | Fodor et al. | |
| 2006/0205191 A1 * | 9/2006 | Kashiwagi | C23C 16/401 438/507 |
| 2006/0291132 A1 | 12/2006 | Kanne et al. | |
| 2009/0159423 A1 | 6/2009 | Kudela et al. | |
| 2010/0037822 A1 | 2/2010 | Ishibashi et al. | |

FOREIGN PATENT DOCUMENTS

| | | |
|---|---|---|
| JP | H03129821 A | 6/1991 |
| JP | 2005-197467 A | 2/2005 |
| JP | 2007-266455 A | 10/2007 |
| JP | 2007266455 A | 10/2007 |
| JP | 2010-512031 A | 4/2010 |
| JP | 2010512031 A | 4/2010 |
| JP | 2011-525299 A | 9/2011 |
| JP | 2011525299 A | 9/2011 |
| KR | 10-0276093 B1 | 12/2000 |
| KR | 10-2006-0085281 A | 7/2006 |
| KR | 10-2009-0125217 A | 12/2009 |
| KR | 10-2010-0003788 A | 1/2010 |
| WO | WO 2008/070181 A2 | 6/2008 |
| WO | WO 2009/137272 A2 | 11/2009 |

OTHER PUBLICATIONS

International Preliminary Report dated May 8, 2014 for PCT/US2012/060668 filed Oct. 17, 2012.

Final Decision of Rejection from Japanese Patent Application No. 2014-538839, dated Apr. 3, 2018, 4 pgs.

Dismissal of Amendment from Japanese Patent Application No. 2014-538839, dated Apr. 3, 2018, 9 pgs.

Notice to File a Response and English summary thereof from Korean Patent Application No. 10-2014-7014069 dated Jul. 24, 2018, 8 pgs.

* cited by examiner

PROCESS CHAMBER FOR ETCHING LOW K AND OTHER DIELECTRIC FILMS

CROSS REFERENCE TO RELATED APPLICATIONS

This is a Divisional of application Ser. No. 13/651,074 filed Oct. 12, 2012 which claims the benefit of U.S. Provisional Application No. 61/552,183 filed on Oct. 27, 2011 titled "Process Chamber for Etching Low K and Other Dielectric Films," the content of which are hereby incorporated by reference in their entirety for all purposes.

TECHNICAL FIELD

Embodiments of the present invention pertain to the field of microelectronic device processing and, in particular, to plasma etching of low-k dielectric films.

DESCRIPTION OF RELATED ART

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology because processing of such films, particularly the etching of such films, has been found to damage and/or render the materials unstable or otherwise unsuitable for device fabrication.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
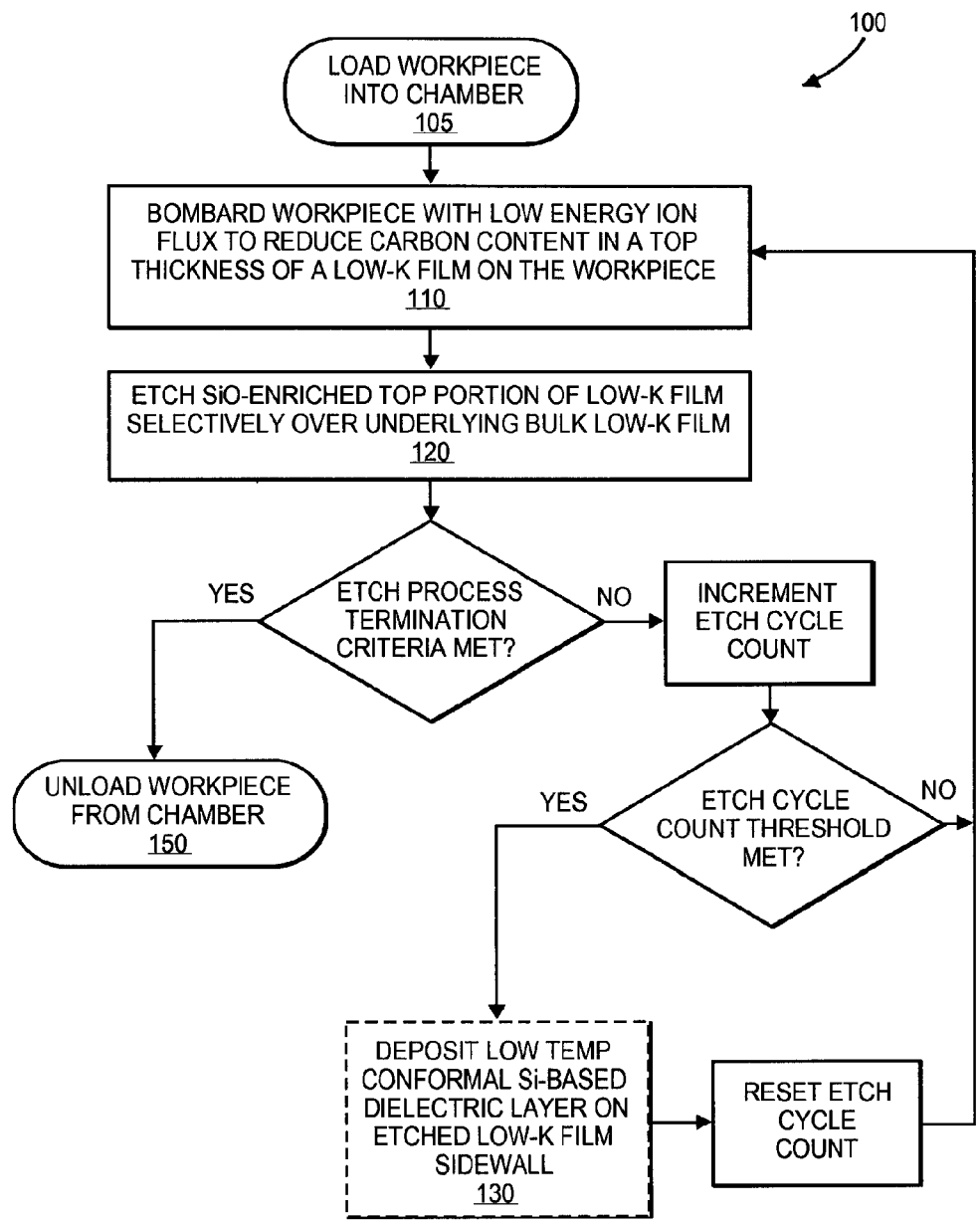
FIG. 1 is a flow diagram illustrating a multi-operational mode etch process for etching a low-k dielectric film with a single plasma etch chamber, in accordance with an embodiment of the invention.

Generally, embodiments of the plasma etch methods described herein leverage damage mechanisms to etch low-k (and other dielectric) materials and leave a remainder of the etched film in good condition. Embodiments of the plasma etch methods described herein cyclically perform at least two separate plasma-based operations in-vaccuo (i.e., without breaking vacuum), and preferably in a same chamber for greatest throughput advantage. During one of these operations, an anisotropic (directional) plasma modifies the bulk structure and/or composition of a portion of the dielectric film being etched to be more like silicon dioxide ($SiO_2$), or a silicon sub-oxide ($SiO_x$). This film modification operation may be conceptualized as controllably and selectively damaging a portion of the dielectric film with the first plasma conditions. During a second of these operations, an isotropic (non-directional) condition removes the modified film portion (having the modified structure or composition) selectively over the underlying dielectric film having the bulk properties. These operations may be performed sequentially and repeatedly to achieve any desired cumulative amount of film removal (i.e., to achieve a desired etch depth). Through this separation of a bulk film etch into two distinct operations or operational modes, the design of the plasma conditions, as well as the design of the etch chamber to provide those conditions, has a significantly greater degree of freedom and/or larger process window.

Separation of the dielectric film etch process into at least these two separate operational modes also provides a level of control over the etch parameters that enables etching an anisotropic profile into the low-k or other dielectric film with advantageously little modification of the dielectric film composition in regions adjacent to the etched feature (e.g., sidewalls are not negatively impacted through exposure to the plasma etch). An important source of this precise control arises from the isotropic etch condition being highly chemical in nature, and as such, providing very high selectivity between the underlying dielectric having bulk properties deviating from that of $SiO_2$ (e.g., incorporating carbon to some degree). While high selectivity between two material compositions is often leveraged to stop an etch after a first material layer is consumed (e.g., in a multi-material deposited film stack as a means to terminate an etch of a layer having an etchable composition with an underlying etch stop layer having a non-etchable composition), the techniques herein incrementally etch through a bulk film with an etch process that is a high selectivity to the bulk film itself.

In embodiments, the multi-operational mode etch processes are entirely fluorocarbon-free. While conventional dielectric etches rely on CF polymer deposited onto the sidewalls of the etched dielectric layer to achieve etch anisotropy, the methods herein achieve etch anisotropy by way of the anisotropy of the film modification process (mode) in combination with the high selectivity of the film etch process (mode). Avoidance of the typically fluorocarbon-based ($C_xF_y$-based) etch process and the attendant CF polymer renders etched dielectric surfaces relatively cleaner of any passivation polymer. As such, post-etch treatment (PET) by plasma or other means which may damage dielectrics (e.g., through oxidation of carbon species in the film) may be avoided.

A more detailed description of the etching method, how such a method may be performed in a single chamber, and chamber hardware adapted to perform embodiments of such an etching method is now provided. Turning first to description of the etching method, FIG. 1 is a flow diagram illustrating a multi-operational mode etch process 100 for etching a low-k dielectric film with a single plasma etch chamber, in accordance with an embodiment of the invention. FIGS. 3A-3F illustrate cross-sectional views representing the effects of the method of multi-operational mode etch process 100 on an exemplary workpiece exposed to the process, in accordance with an embodiment of the present invention.

Beginning at operation 105, a workpiece is loaded in a plasma processing chamber. While the workpiece may generally take any form, in the illustrative embodiment presented in FIG. 3A, the workpiece includes a substrate 302 upon which a dielectric to be etched is disposed. The substrate 302 may be of any material suitable to withstand a fabrication process and serves as a basis for which microelectronic device layers may be disposed and/or formed, such as those for IC, optical, solar, MEMs, or similarly micro/nano fabricated devices. In accordance with an embodiment of the present invention, substrate 302 is composed of a group IV-based material such as, but not limited to, crystalline silicon, germanium or silicon/germanium. In a specific embodiment, substrate 302 is a monocrystalline silicon substrate. In another embodiment, substrate 302 is composed of a III-V material. In another embodiment, a plurality of active devices is disposed within the region demarked as substrate 302.

The workpiece further includes exposed dielectric to be etched. In the exemplary embodiments illustrated in FIGS. 1 and 3A-3F, the exposed dielectric is a low-k material, but more generally may be any material which is not silicon dioxide and is modifiable into a material more like silicon oxide ($SiO_x$) by the mechanisms described herein. In the exemplary embodiment illustrated in FIG. 3A, the low-k dielectric layer 304 has a permittivity less than that of silicon dioxide, e.g., less than approximately 3.9. In a further embodiment, the low-k dielectric layer 304 is a material such as, but not limited to, a fluorine-doped silicon dioxide, a carbon-doped silicon dioxide, a porous silicon dioxide, a porous carbon-doped silicon dioxide, a spin-on silicone based polymeric dielectric, or a spin-on organic polymeric dielectric. In accordance with one illustrative embodiment, the low-k dielectric layer 304 is a porous SiCOH layer having a bulk dielectric constant of less than 2.7.

Figure 3A:
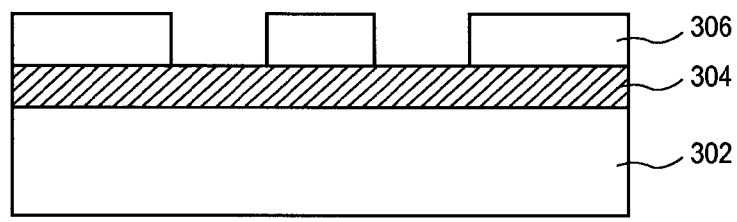
FIGS. 3A, 3B, 3C, 3D, 3E, and 3F illustrate cross-sectional views representing the effects of the method of multi-operational mode etch process 100 on an exemplary workpiece exposed to the process, in accordance with an embodiment of the present invention.

While the multi-operational mode etch process 100 is applicable to unmasked etches, for example in etches where underlying topography is utilized to form features in a low-k dielectric layer (e.g., a low-k spacer etch), in the illustrative embodiment the low-k dielectric layer 304 is masked (e.g., for a via or trench etch). As illustrated in FIG. 3A, the mask layer 306 is a photoresist layer or hardmask layer disposed over a portion of the low-k dielectric layer 304. The photoresist may be any known in the art (e.g., 193, EUV, etc.). Similarly, where the mask layer 306 is a hardmask, any material known in the art capable of providing a desired selectivity to a $SiO_x$, etch process may be utilized. Exemplary materials include: amorphous carbon (e.g., APF®), nitrides of silicon or metals (e.g., titanium or tantalum), carbides of silicon or metal, etc.

Returning to FIG. 1, at operation 110, exposed portions of the workpiece are bombarded with an ion flux to modify the properties of the exposed material layer, and more particularly reduce carbon content in a top thickness of a low-k film. The ion flux is preferably anisotropic such that regions underlying a mask are not exposed to the flux. The ion flux may be of one or more types of atomic or molecular species having a low ion energy. As such, in one advantageous embodiment, the species is to mechanically mill off constituents in the low-k material (e.g., knock-off methyl groups) rather than chemically react with them and therefore the ion flux is to originate from a source gas having relatively low chemical reactivity with the target constituent. Exemplary ionic species include helium ions, neon ions, xenon ions, nitrogen ions, or argon ions with Ar+ being preferred as having a low ionization potential (e.g., 2-4 eV) such that very low plasma DC biases can be provided to reduce energy levels of the ion flux. Electropositive diluents, like neon and helium may also be added to an argon environment to further tune the ion flux energy. Process pressures are advantageously below 10 mTorr for more directionality and more advantageously below 5 mTorr. Low RF powers on the order of 50 W to 100 W, depending on the ionization potential of the feed gas, have been found advantageous for modifying a low-k dielectric film by knocking out carbon species from the silicon-oxide matrix.

Figure 3B:
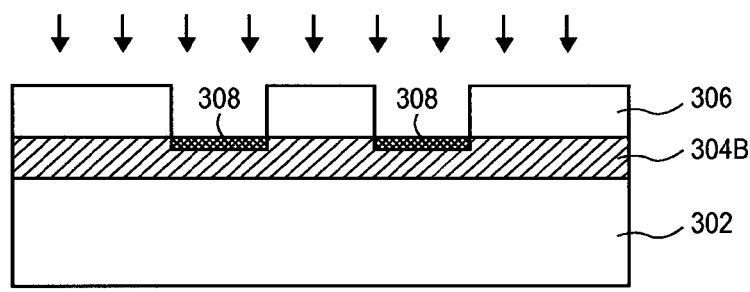

FIG. 3B illustrates the effect of operation 110 on a workpiece. As shown, the ion flux 307 forms modified portions 308 of the low-k dielectric layer 304. In an embodiment, the modified portions 308 are carbon-depleted, and therefore $SiO_x$ enriched, relative to the bulk, unmodified portions of the low-k dielectric layer 304. Film density and morphology of the modified portions 308 may also be altered related to the low-k dielectric layer 304. For example, the modified portions 308 may be densified or otherwise mechanically damaged (e.g., roughened) by the ion bombardment during operation 110. Depending on the ion flux, the depth of the modified portions 308 may amount to 50 Å or less.

Figure 3C:
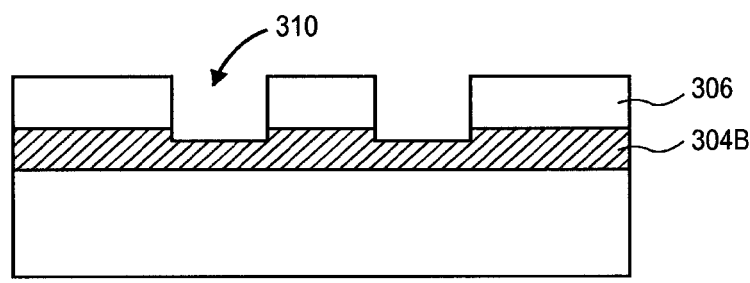

Returning to FIG. 1, at operation 120, a dry etch process is employed to remove the $SiO_x$-enriched modified portion of the low-k dielectric layer selectively over the underlying bulk (or unmodified portion 304B of the low-k dielectric layer 304 in FIG. 3C). The etching operation 120 is to be considered atomic layer etching or molecular level etching (MLE) since the modified portion removed is on the order of the dimension of the molecular constituents in the low-k dielectric film In one embodiment, operation 120 entails a plasma generated from at least nitrogen trifluoride ($NF_3$) and a hydrogen source, such as ammonia ($NH_3$) or water vapor ($H_2O$) to generate reactive etch species $NH_4F$ and/or $NH_4F$—$HF$. In a further embodiment, water vapor ($H_2O$) is provided along with the $NF_3$ and $NH_3$ to further enhance the $SiO_x$ etch rate at operation 120. Nonreactive gases (e.g., He) may also be utilized during operation 120.

In another embodiment, the etch process 100 employs a siconi-type etching technique, which is further described in more detail in U.S. patent application Ser. No. 12/620,806, commonly assigned, entails a two step mechanism that is to be performed during the operation 120. In this embodiment, water vapor ($H_2O$) and a thin solid silicate etch byproduct (e.g., $(NH_4)_2SiF_6$) is formed at a lower first workpiece temperature (e.g., 30° C.) and the silicate is then sublimed from the workpiece at a higher second workpiece temperature (e.g., 100° C.). In certain embodiments however, for example where a higher etch rate is desired, the siconi etching is performed at a fixed elevated workpiece temperature. Without the additional overhead of cycling the substrate temperature, the etch process 100 may be cycled more rapidly for a higher etch rate. Preferably, the fixed workpiece temperature at operation 120 is between about 80° C. and 100° C. While higher temperatures are possible for hardmask and unmasked embodiments of method 100, the maximum fixed workpiece temperature at operation 120 for embodiments employing photoresist is below approximately 120° C. so as to avoid reticulation. In certain embodiments, both operations 110 and 120 are performed at the fixed elevated temperature to avoid any overhead relating to cycling the workpiece temperature.

Returning to FIG. 1, an etch process controller determines if an etch process termination criteria is met subsequent to the completion of operation 120. The etch process termination criteria may be based on a process duration, endpoint signal (optical or otherwise), or the like. If the etch process termination criteria is met, the process 100 is complete and the workpiece is unloaded from the chamber 150. If the etch process termination criteria is not yet met, a subsequent iteration is initiated by returning to operation 110.

For a further embodiment, a low-temp conformal silicon-based dielectric layer is deposited over the workpiece at operation 130. The deposition operation 130 may be periodically performed during the etch process 100, for example to combat any profile undercut or bow that results from the modification operation 110 not being perfectly anisotropic as a function of the ion flux not being an ideally collision-less mode of transport. As illustrated in FIG. 1, the deposition operation 130 is performed only on the condition an etch cycle count threshold has been met where each etch cycle entails a single performance of both operations 110 and 120. As such, the deposition operation 130 may be performed with every etch cycle (etch cycle count threshold of 1) or at some lesser rate (etch cycle count threshold greater than 1) for a "multi-X" cyclic process interleaving the etch and deposition operations together at a predetermined ratio or duty cycle.

Figure 3D:
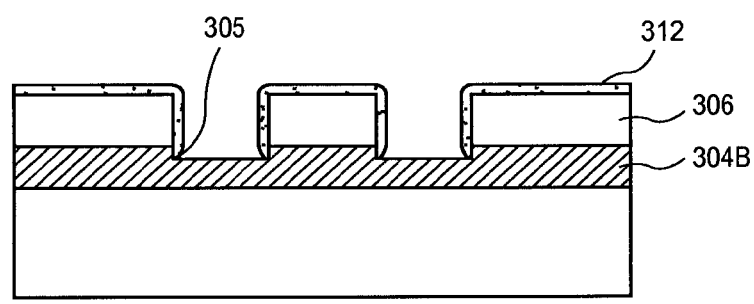
Figure 3E:
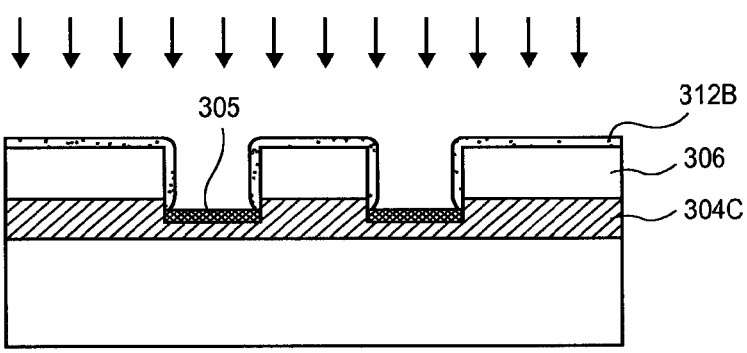
Figure 3F:
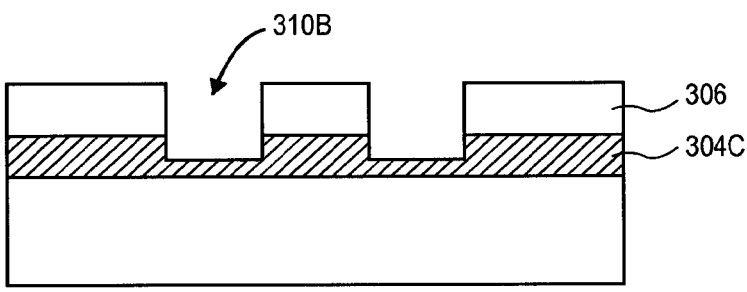

As further shown in FIG. 3D, the deposition operation 130 forms a protection layer 312 which is formed at least on the sidewalls of the bulk low-k dielectric 304B exposed by the etch operation 120. The thickness of the protection layer 312 may vary widely depending on the frequency at which operation 130 is performed relative to the etch operation 120. Generally, the deposition operation 130 entails a conformal deposition process to ensure sidewall coverage. In embodiments, the conformal deposition process is low temperature (e.g., below 130° C.) so as to preserve the overlying mask material (e.g., photoresist). In an embodiment, the protecting layer 312 is a silicon dioxide. However, in one advantageous embodiment, the protecting layer 312 is a carbon-doped silicon oxide. Deposition of a carbon doped layer may advantageously increase resistance of the protection layer 130 to the etch operation 120 such that a subsequent iteration through the etch operation 120 will not completely remove the protection layer 130, particularly from the sidewalls of the trench 310. In still another embodiment, the protecting layer 312 is a silicon nitride. For carbon doped and nitride embodiments where the protection layer 130 offers selectivity to the etch operation 120, the etch cycle count threshold may be made higher for a greater portion of the process 100 expended on etching, and an increase in the overall low-k dielectric etch rate.

Depending on the embodiment, any commonly known silicon precursor may be employed at operation 130, such as, but not limited to silicon tetrafluoride ($SiF_4$), silicon tetrachloride ($SiCl_4$), silane ($SiH_4$), or any commonly known silicon-containing carbonized precursor, such as, but not limited to, octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS). In further embodiments, where the protection layer is to be nitride, precursors, such as, but not limited to trisillylamine (TSA) and disillylamine (DSA) may be utilized. Any of these sources may be reacted with an oxygen radical source such as, but not limited to, oxygen ($O_2$), ozone ($O_3$), carbon dioxide ($CO_2$), or water ($H_2O$) in a PECVD process.

Following operation 130, a subsequent iteration is performed by returning to operation 110. In this manner, the etch front is incrementally advanced through the target film, as further shown in FIGS. 3E and 3F, to form a progressively deeper trench 310B.

Figure 2:
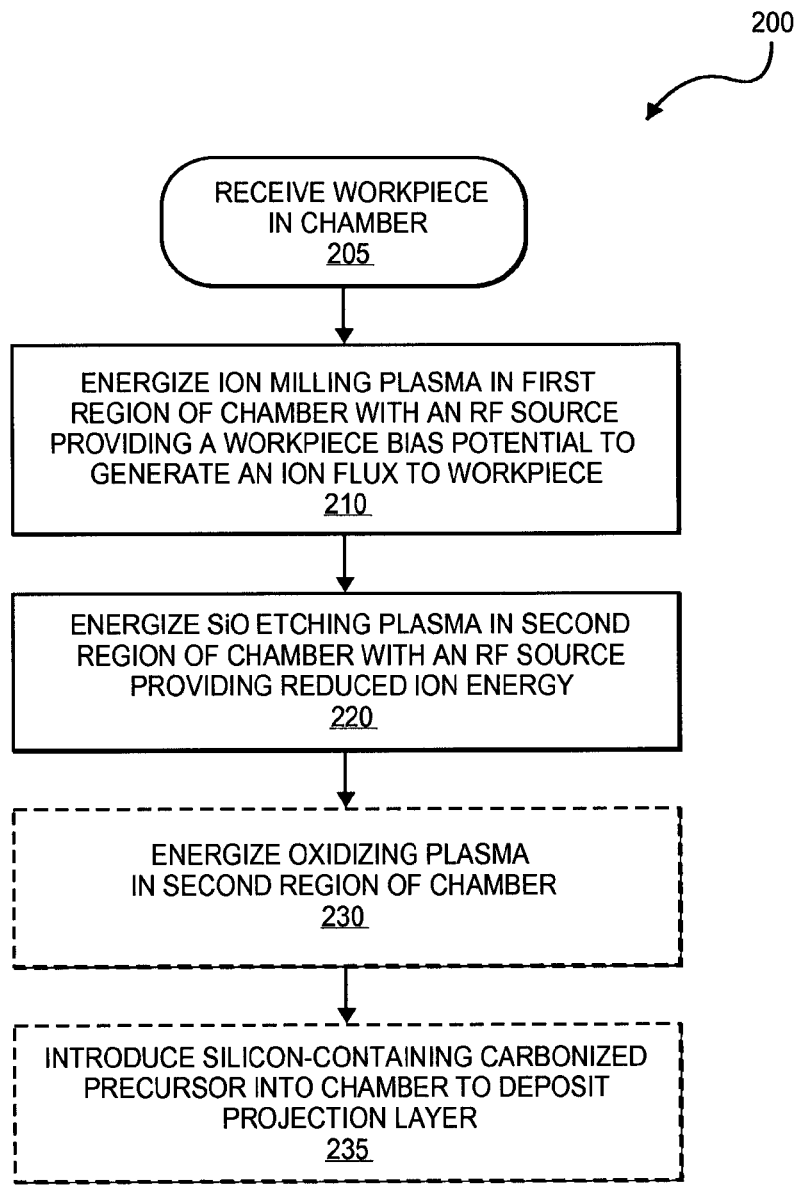
FIG. 2 is a flow diagram further illustrating how an etch chamber may operate in the multiple modes utilized by the etch process illustrated in FIG. 1, in accordance with an embodiment.

FIG. 2 is a flow diagram further illustrating how an etch chamber may operate in the multiple modes of the etch process 100. Method 200 begins with receiving the workpiece in the chamber at operation 205. The ion milling plasma is energized in a first region of the chamber disposed below a showerhead closest to the workpiece. An RF source provides a DC bias potential on the workpiece to generate the ion flux described elsewhere herein for the modification operation 110. In embodiments, the RF source is capacitively coupled through a pedestal or chuck upon which the workpiece is supported to generate a plasma in the first chamber region directly over the workpiece. In one such embodiment, the capacitively coupled plasma (CCP) is launched from the chuck (i.e., chuck is RF driven) and the showerhead closest to the workpiece provides the RF return path (i.e., as anode).

During operation 220, a SiO etching plasma is energized in a second region of the chamber to minimize, or avoid, biasing the workpiece in a manner that would induce ion flux to the workpiece. In one embodiment, to render the etching operation 220 highly chemical in nature, the second chamber region is disposed above the showerhead closest to the workpiece and therefore relatively more remote from the workpiece than the ion milling plasma generated during operation 210. In an embodiment, the pedestal or chuck is not RF powered during operation 220 to minimize workpiece bias potential. Remote and/or soft ionization techniques are employed at operation 220 to form the reactive species for the etching operation 120 described elsewhere herein without forming a significant bias potential on the workpiece. In one such embodiment, a second CCP is launched to or from the showerhead closest to the workpiece from or to an electrode disposed on a side opposite the showerhead from the wafer (e.g., from or to an electrode above the showerhead closest to the workpiece). In another embodiment, a DC discharge is employed as a source of electrons for soft ionization during the etching operation 120. In an alternative embodiment, a remote plasma source (RPS) is employed to form the plasma in the second region of the chamber. In still another embodiment, an inductively coupled plasma (ICP) is employed to form the plasma in the second region of the chamber. Etch chamber hardware configurations for each of these embodiments is further described elsewhere herein.

For embodiments which deposit a protection layer (e.g., operation 130 in FIG. 1), an oxidizing plasma is generated in the remote second region of the chamber and the silicon (and carbon) containing precursor is introduced into the chamber, for example into the first chamber region, to react with oxidizing species transported to the workpiece. As such, a first region and first operational mode of a plasma etch chamber may be utilized for modifying a partial thickness of a low-k dielectric film and a second region and second operational mode of the plasma etch chamber may be utilized for etching the modified thickness of the low-k dielectric film. The second region may further be operated in a third operational mode to deposit a protection layer.

For embodiments which utilize a siconi-type process, the two stages of the siconi-type etch may further entail two different plasmas launched and generated in the different regions of the etching chamber. For example, both the first and second chamber regions may be utilized to perform the siconi-type process, or the second chamber region and a third chamber region may be employed to perform the siconi-type process.

Figure 4:
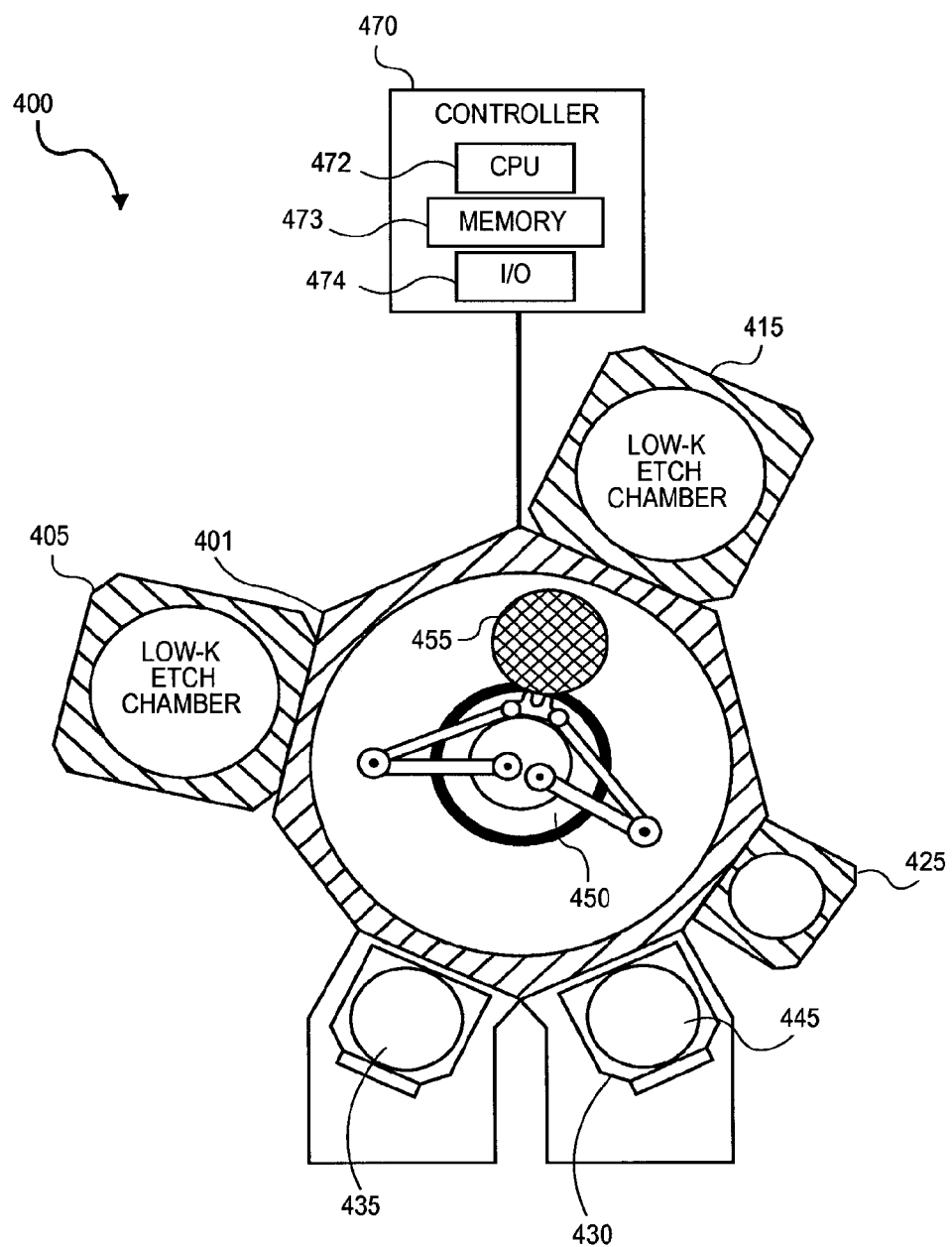
FIG. 4, is a plan view of a multi-chambered processing platform that may be configured to include one or more etch chambers to perform the multi-operational mode etch process illustrated in FIG. 1, in accordance with an embodiment.

As shown in FIG. 4, one or more low-k etch chambers 405, configured as described elsewhere herein, are coupled to an integrated platform to form a multi-chambered processing system. One or more of the embodiments described for the multi-operational mode etch process 100 may be performed by each of the low-k etch chamber 405 in the multi-chambered system depicted in FIG. 4. Referring to FIG. 4, the multi-chambered processing platform 400, may be any platform known in the art that is capable of adaptively controlling a plurality of process modules simultaneously. Exemplary embodiments include an Opus™ AdvantEdge™ system, a Producer™ system, or a Centura™ system, all commercially available from Applied Materials, Inc. of Santa Clara, Calif.

The processing platform 400 may further include an integrated metrology (IM) chamber 425 to provide control signals to allow adaptive control of any of the etch processes described herein. The IM chamber 425 may include any metrology commonly known in the art to measure various film properties, such as thickness, roughness, composition, and may further be capable of characterizing grating parameters such as critical dimensions (CD), sidewall angle (SWA), feature height (HT) under vacuum in an automated manner. As further depicted in FIG. 4, the multi-chambered processing platform 400 further includes load lock chambers 430 holding front opening unified pods (FOUPS) 435 and 445, coupled to the transfer chamber 401 having a robotic handler 450.

As the etch process performed in the low-k etch chambers 405 iteratively progresses with each cycle of the process 100, the low-k etch chambers 405 may automatically cycle through the process 200, actuating relays coupling an RF source to different electrode and/or operating distinct RF sources separately coupled to different electrodes to modulate between the operational modes. Such control over the low-k etch chambers 405 may be provided by one or more controller 470. The controller 470 may be one of any form of general-purpose data processing system that can be used in an industrial setting for controlling the various subprocessors and subcontrollers. Generally, the controller 470 includes a central processing unit (CPU) 472 in communication with a memory 473 and an input/output (I/O) circuitry 474, among other common components. Software commands executed by the CPU 472, cause the multi-chambered processing platform 400 to, for example, load a substrate into the low-k etch chamber 405, execute the multi-operation mode etch process 200, and unload the substrate from the low-k etch chamber 405. As known in the art, additional controllers of the robotic handler 450, or load lock chambers 430 is provided to manage integration of multiple low-k etch chambers 405.

Figure 5A:
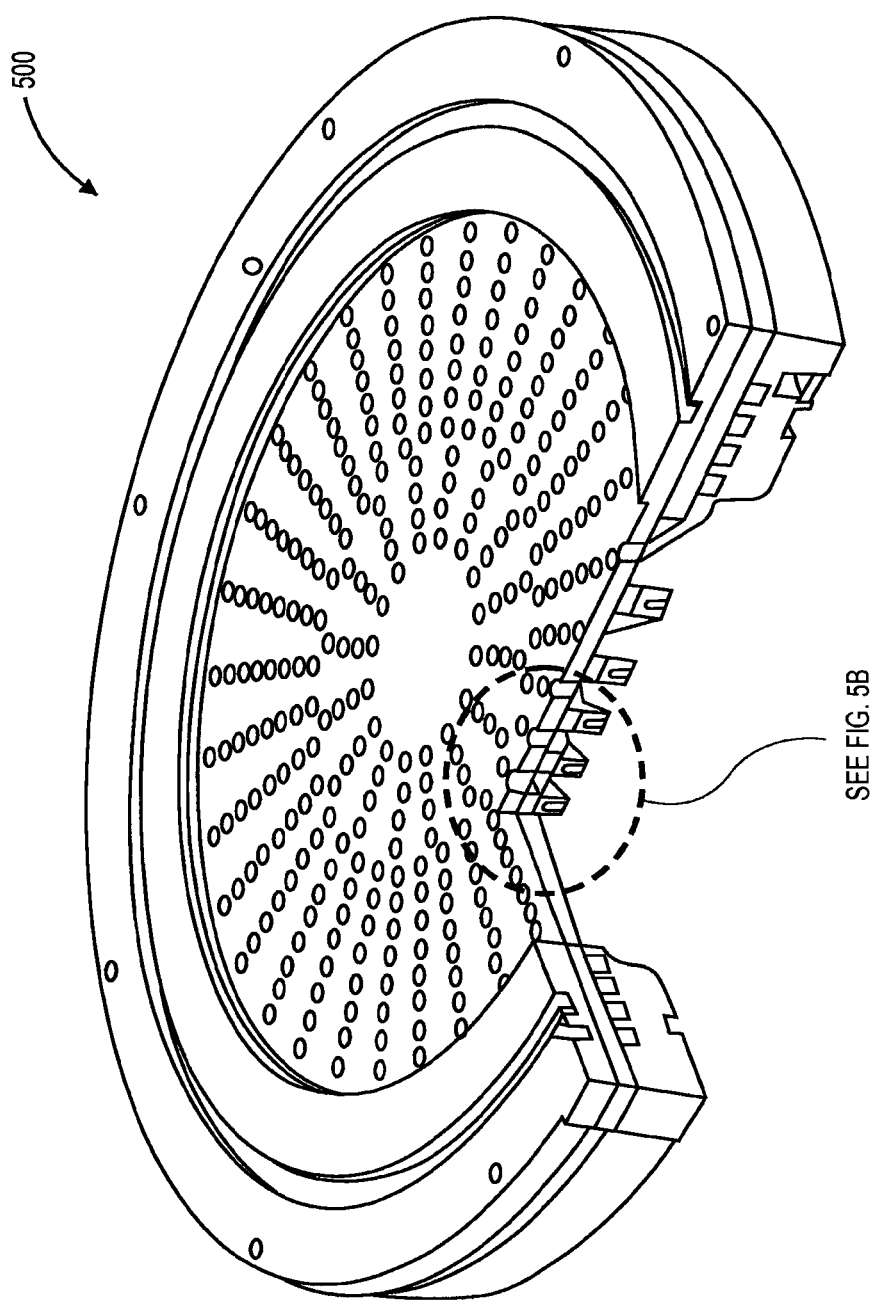
FIG. 5A depicts a cutout perspective view of a dual zone showerhead which may be utilized in an etch chamber to perform the multi-operational mode etch process illustrated in FIG. 1, in accordance with an embodiment.
Figure 5B:
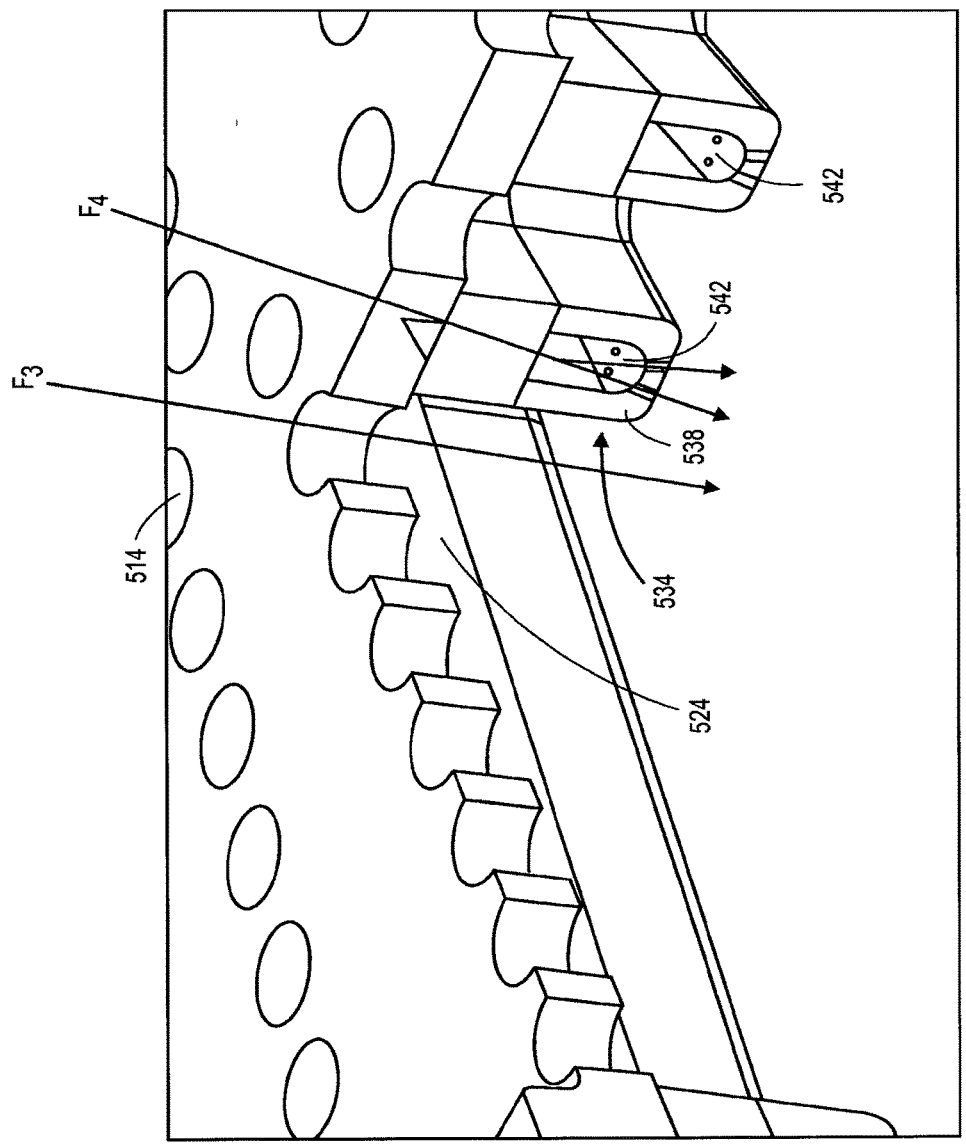
FIG. 5B illustrates an enlarged portion of the cutout perspective view of FIG. 5A, in accordance with embodiments of the present invention.

One or more of the etch process chambers described in detail elsewhere herein may employ either a conventional showerhead or a "dual zone" showerhead (DZSH) for distribution and transport of fluids (reactive species, gases, etc.) to the workpiece. While a detailed description of a DZSH may be found in U.S. patent application Ser. No. 12/836, 726, commonly assigned, FIGS. 5A and 5B illustrate some features of a DZSH 500 which may be advantageously leveraged in particular embodiments of a multi-operational mode plasma etch chamber. FIG. 5A depicts a cutout perspective view of the DZSH and FIG. 5B illustrates an enlarged portion of the cutout perspective view of FIG. 5A. As shown, the DZSH 500 includes an upper manifold 510 with a plurality of first apertures 514 and a lower manifold 530 having a plurality of second apertures 524. A first fluid flow, $F_3$ is through the showerhead via the apertures 514, second openings 524 in a center manifold, and second openings 534 in the bottom manifold 530 before entry into a processing region disposed below the DZSH 500. A second fluid flow $F_4$ is through a channel network to one or more of the second gas channels 538 and is delivered to the processing region through apertures 542. The first fluid and the second fluid are isolated from one another in the DZSH until their respective delivery into the processing region. As such, the first fluid may be provided in an energized state (e.g., as a radical or ionic species) while the second fluid may be provided in an unreacted and/or unenergized state.

In an embodiment, a plasma etch chamber includes a plasma source coupled to a DZSH. In one embodiment, a "Siconi etch" source may be adapted from a Siconi etch/ preclean chamber (commercially available from Applied Materials) to provide at least one plasma for the multiple operative mode chambers described herein. For example, the Siconi etch source may provide at least one of a first capacitive plasma source to implement the ion milling operation (e.g., 110 of FIG. 1), and a second capacitively coupled plasma source to implement the etching operation (e.g., 120 of FIG. 1) and/or the optional deposition operation described herein (e.g., 130 of FIG. 1).

Figure 6A:
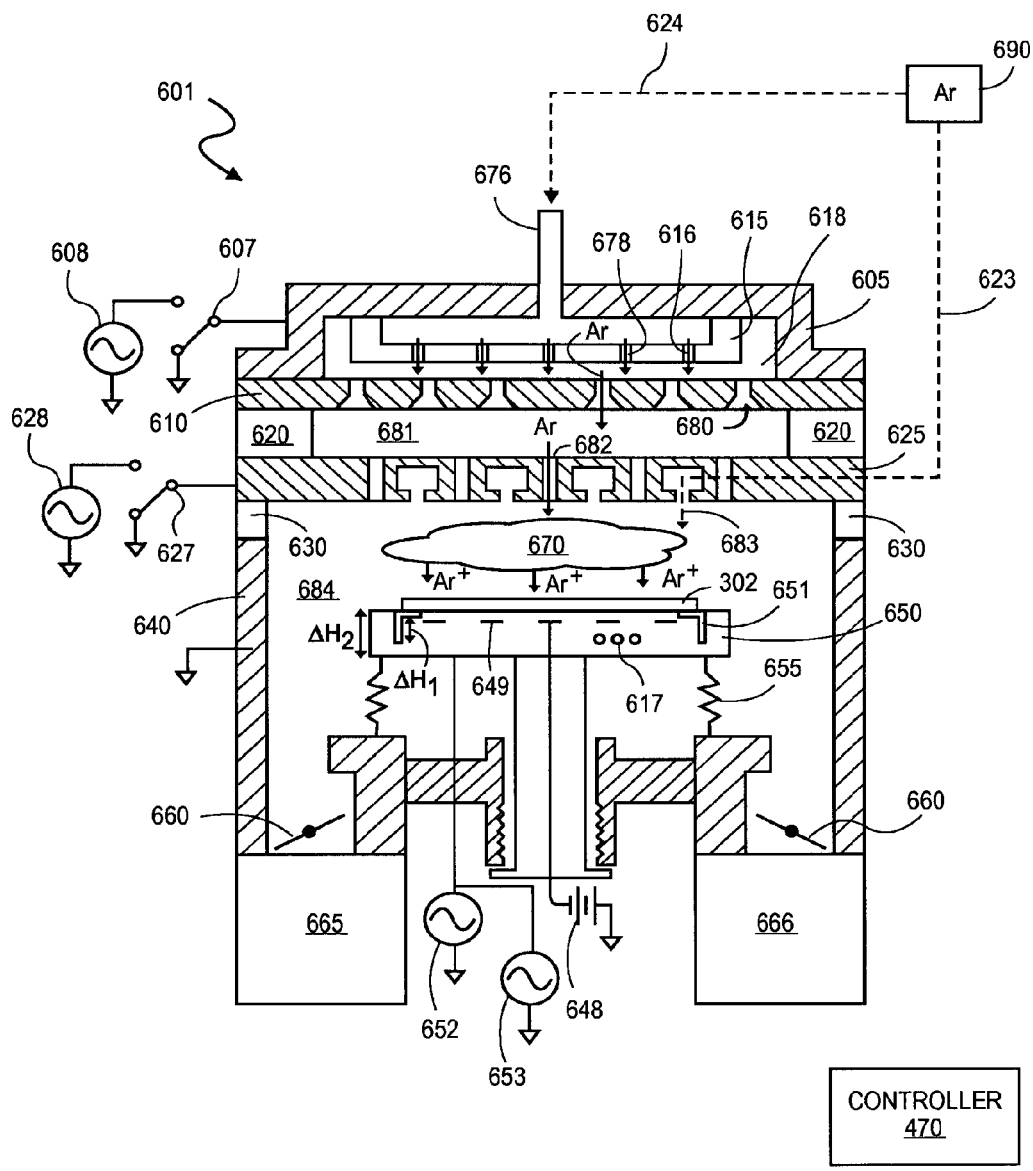
FIG. 6A illustrates a cross-sectional view of an etch chamber configured to perform the modification operation of the etch process illustrated in FIG. 1, in accordance with an embodiment.
Figure 6B:
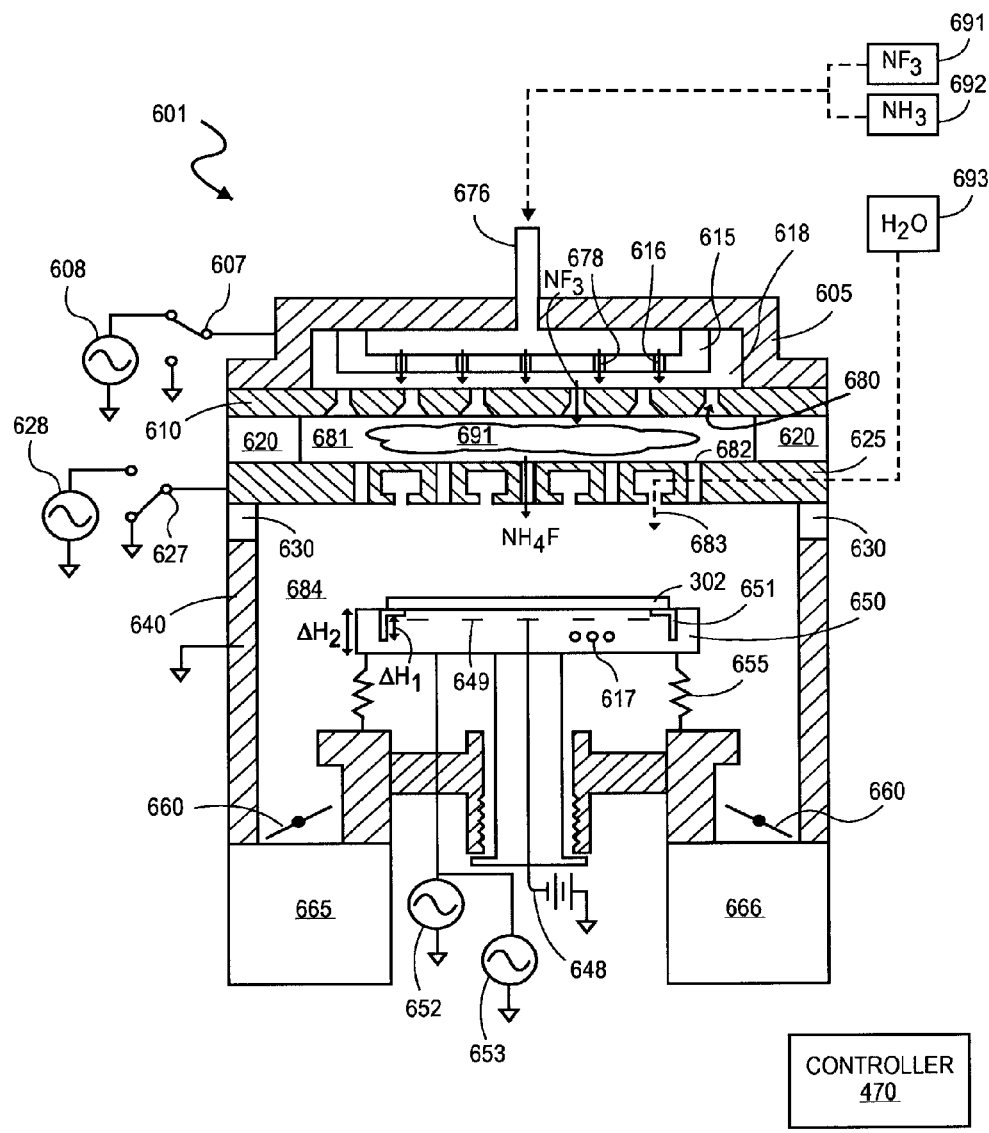
FIG. 6B illustrates a cross-sectional view of an etch chamber configured to perform the etching operation of the etch process illustrated in FIG. 1, in accordance with an embodiment.
Figure 6C:
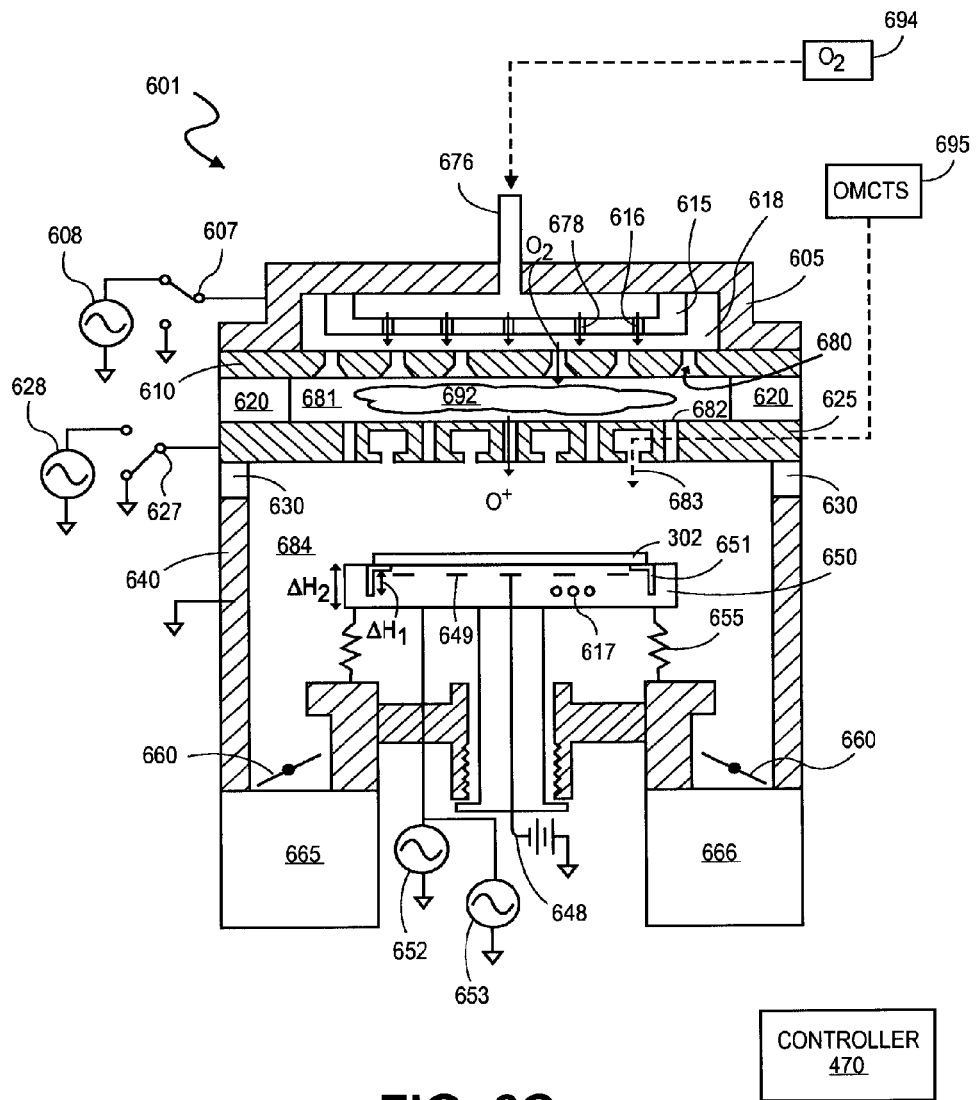
FIG. 6C illustrates a cross-sectional view of an etch chamber configured to perform the deposition operation of the etch process illustrated in FIG. 1, in accordance with an embodiment.

FIGS. 6A, 6B and 6C illustrate cross-sectional views of an etch chamber configured into multiple modes (states) of operation, to perform each of the operations in the etch process 100 (FIG. 1), in accordance with an embodiment. Generally, the etch chamber 601 includes a first capacitively coupled plasma source to implement the ion milling operation, a second capacitively coupled plasma source to implement the etching operation and to implement the optional deposition operation. FIG. 6A illustrates a cross-sectional view of an etch chamber 601 configured to perform the modification operation 110 (FIG. 1), in accordance with an embodiment. The etch chamber 601 has grounded chamber walls 640 surrounding a chuck 650. In embodiments, the chuck 650 is an electrostatic chuck (ESC) which clamps the workpiece 302 to a top surface of the chuck 650 during processing, though other clamping mechanisms known in the art may also be utilized.

The chuck 650 includes an embedded heat exchanger coil 617. In the exemplary embodiment, the heat exchanger coil 617 includes one or more heat transfer fluid channels through which heat transfer fluid, such as an ethylene glycol/water mix, Galden® or Fluorinert®, etc. may be passed to control the temperature of the chuck 650 and ultimately the temperature of the workpiece 302.

The chuck 650 includes a mesh 649 coupled to a high voltage DC supply 648 so that the mesh 649 may carry a DC bias potential to implement the electrostatic clamping of the workpiece 302. The chuck 650 is coupled to a first RF power source and in one such embodiment, the mesh 649 is coupled to the first RF power source so that both the DC voltage offset and the RF voltage potentials are coupled across a thin dielectric layer on the top surface of the chuck 650. In the illustrative embodiment, the first RF power source includes a first and second RF generator 652, 653. The RF generators 652, 653 may operate at any industrial frequency known in the art, however in the exemplary embodiment the RF generator 652 operates at 60 MHz to provide advantageous directionality. Where a second RF generator 653 is also provided, the exemplary frequency is 2 MHz.

With the chuck 650 to be RF powered, an RF return path is provided by a first showerhead 625. The first showerhead 625 is disposed above the chuck to distribute a first feed gas into a first chamber region 684 defined by the first showerhead 625 and the chamber wall 640. As such, the chuck 650 and the first showerhead 625 form a first RF coupled electrode pair to capacitively energize a first plasma 670 of the first feed gas within a first chamber region 684. A DC plasma bias (i.e., RF bias) resulting from capacitive coupling of the RF powered chuck generates an ion flux from the first plasma 670 to the workpiece 302 (e.g., Ar ions where the first feed gas is Ar) to provide an ion milling plasma (e.g., operation 220 in FIG. 2). The first showerhead 625 may be grounded or alternately coupled to an RF source 628 RF having one or more generators operable at a frequency other than that of the chuck 650 (e.g., 13.56 MHz or 60 MHz). In the illustrated embodiment the first showerhead 625 is selectably coupled to ground or the RF source 628 through the relay 627 which may be automatically controlled during the etch process, for example by the controller 470.

As further illustrated in FIG. 6A, the etch chamber 601 includes a pump stack capable of high throughput at low process pressures. In embodiments, at least one turbo molecular pump 665, 666 is coupled to the first chamber region 684 through a gate valve 660 and disposed below the chuck 650, opposite the first showerhead 625. The turbo molecular pump(s) 665, 666 may be any commercially available having suitable throughput and more particularly is to be sized appropriately to maintain process pressures below 10 mTorr and preferably below 5 mTorr at the desired flow rate of the first feed gas (e.g., 50 to 500 sccm of Ar). In the embodiment illustrated in FIG. 6A, the chuck 650 forms part of a pedestal which is centered between the two turbo pumps 665 and 666, however in alternate configurations chuck 650 may be on a pedestal cantilevered from the chamber wall 640 with a single turbo molecular pump having a center aligned with a center of the chuck 650.

Disposed above the first showerhead 625 is a second showerhead 610. In one embodiment, during processing, the first feed gas source, for example, Argon bottle 690 is coupled to a gas inlet 676, and the first feed gas flowed through a plurality of apertures 680 extending through second showerhead 610, into the second chamber region 681, and through a plurality of apertures 682 extending through the first showerhead 625 into the first chamber region 684. An additional flow distributor 615 having apertures 678 may further distribute a first feed gas flow 616 across the diameter of the etch chamber 601. In an alternate embodiment, the first feed gas is flowed directly into the first chamber region 684 via apertures 683 which are isolated from the second chamber region 681 (denoted by dashed line 623). For example, where the first showerhead is a DISH, the apertures 683 correspond to apertures 542 in FIG. 5B.

FIG. 6B illustrates a cross-sectional view of the etch chamber 601 reconfigured from the state illustrated in FIG. 6A to perform the etching operation 120 of FIG. 1, in accordance with an embodiment. As shown, a secondary electrode 605 is disposed above the first showerhead 625 with a second chamber region 681 there between. The secondary electrode 605 may further form a lid of the etch chamber 601. The secondary electrode 605 and the first showerhead 625 are electrically isolated by a dielectric ring 620 and form a second RF coupled electrode pair to capacitively discharge a second plasma 691 of a second feed gas within the second chamber region 681. Advantageously, the second plasma 691 does not provide a significant RF bias potential on the chuck 650. As illustrated in FIG. 6B, at least one electrode of the second RF coupled electrode pair is coupled to an RF source for energizing an etching plasma at operation 220 in FIG. 2 (during the etching operation 120 in FIG. 1). The secondary electrode 605 is electrically coupled to the second showerhead 610. In a preferred embodiment, the first showerhead 625 is coupled to a ground plane or floating and may be coupled to ground through a relay 627 allowing the first showerhead 625 to also be powered by the RF power source 628 during the ion milling mode of operation. Where the first showerhead 625 is grounded, an RF power source 608, having one or more RF generators operating at 13.56 MHz or 60 MHz for example is coupled to the secondary electrode 605 through a relay 607 which will allow the secondary electrode 605 to also be grounded during other operational modes (e.g., during ion milling operation 110), although the secondary electrode 605 may also be left floating if the first showerhead 625 is powered.

A second feed gas source, such as an $NF_3$ bottle 691, and a hydrogen source, such as $NH_3$ bottle 692, is coupled to the gas inlet 676. In this mode, the second feed gas flows through the second showerhead 610 and is energized in the second chamber region 681. Reactive species (e.g., $NH_4F$) then pass into the first chamber region 684 to react with the workpiece 302. As further illustrated, for embodiments where the first showerhead 625 is a DZSH, one or more feed gases may be provided to react with the reactive species generated by the second plasma 691. In one such embodiment, a water source 693 may be coupled to the plurality of apertures 683.

In an embodiment, the chuck 650 is movable along the distance $\Delta H_2$ in a direction normal to the first showerhead 625. The chuck 650 is on an actuated mechanism surrounded by a bellows 655, or the like, to allow the chuck 650 to move closer to or farther away from the first showerhead 625 as a means of controlling heat transfer between the chuck 650 and the first showerhead 625 (which is at an elevated temperature of 80° C.-150° C., or more). As such, a siconi etch process may be implemented by moving the chuck 650 between first and second predetermined positions relative to the first showerhead 625. Alternatively, the chuck 650 includes a lifter to elevate the workpiece 302 off a top surface of the chuck 650 by distance $\Delta H_1$ to control heating by the first showerhead 625 during the etch process. In other embodiments, where the etch process is performed at a fixed temperature (e.g., ~90-110° C.), chuck displacement mechanisms can be avoided.

The controller 470 is to alternately energize the first and second plasmas 690 and 691 during the etching process by alternately powering the first and second RF coupled electrode pairs automatically.

FIG. 6C illustrates a cross-sectional view of the etch chamber 601 reconfigured to perform the deposition operation 130 illustrated in FIG. 1, in accordance with an embodiment. As shown, a third plasma 692 is generated in the second chamber region 681 by an RF discharge which may be implemented in any of the manners described for the second plasma 691. Where the first showerhead 625 is powered to generate the third plasma 692 during a deposition, the first showerhead 625 is isolated from a grounded chamber wall 640 by a dielectric spacer 630 so as to be electrically floating relative to the chamber wall. In the exemplary embodiment, an oxidizer ($O_2$) feed gas source 694 is coupled to the gas inlet 676. In embodiments where the first showerhead 625 is a DZSH, any of the silicon containing precursors described elsewhere herein (e.g., OMCTS source 695) may be coupled into the first chamber region 684 to react with reactive species passing through the first showerhead 625 from the third plasma 692. Alternatively the silicon containing precursor is also flowed through the gas inlet 676 along with the oxidizer.

Figure 7:
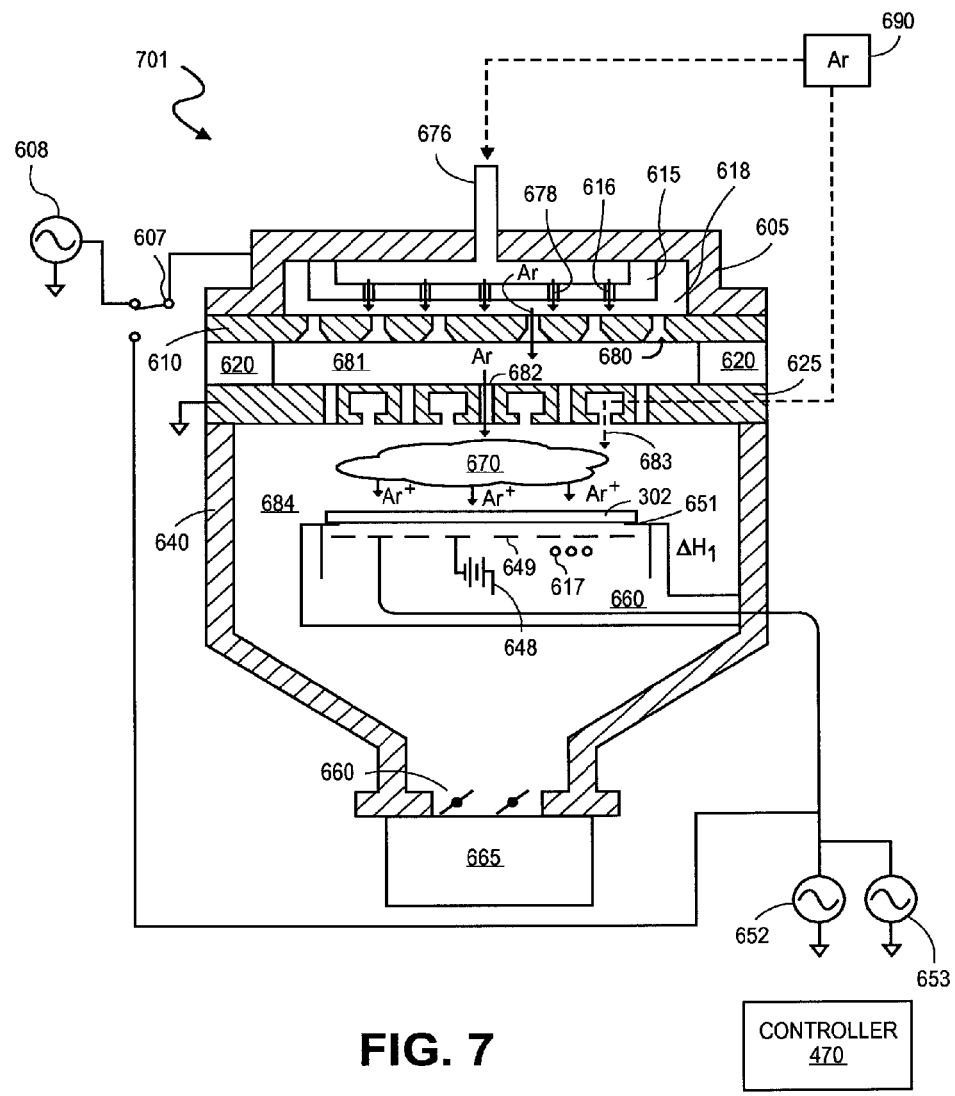
FIG. 7 illustrates a cross-sectional view of an etch chamber configured to perform the modification operation of the etch process illustrated in FIG. 1, in accordance with an embodiment.

FIG. 7 illustrates a cross-sectional view of an etch chamber 701 configured to perform the modification operation 110, in accordance with an embodiment. As shown, the etch chamber 701 has a cantilevered chuck 660 and a single turbo pump 665 having a center aligned with a center of the chuck 660. As further shown, the first showerhead 625 is grounded while the chuck 660 and secondary electrode 605 are both coupled to a same RF source via a relay 607 to alternate the driven electrode between the chuck 660 and the secondary electrode 605 between the ion milling and etching operations 210 and 220 to implement the modification and etching operations 110 and 120, respectively, with the location of the plasma changing between the first chamber region 684 and the second region 681 in the manner described in the context of the chamber 601. Alternatively, RF source 608 may power the secondary electrode independently of the RF source powering the chuck 660 (e.g., one or more of generators 652 and 653) with the location of the plasma changing between the first chamber region 684 and the second region 681 in the manner described in the context of the chamber 601.

Figure 8A:
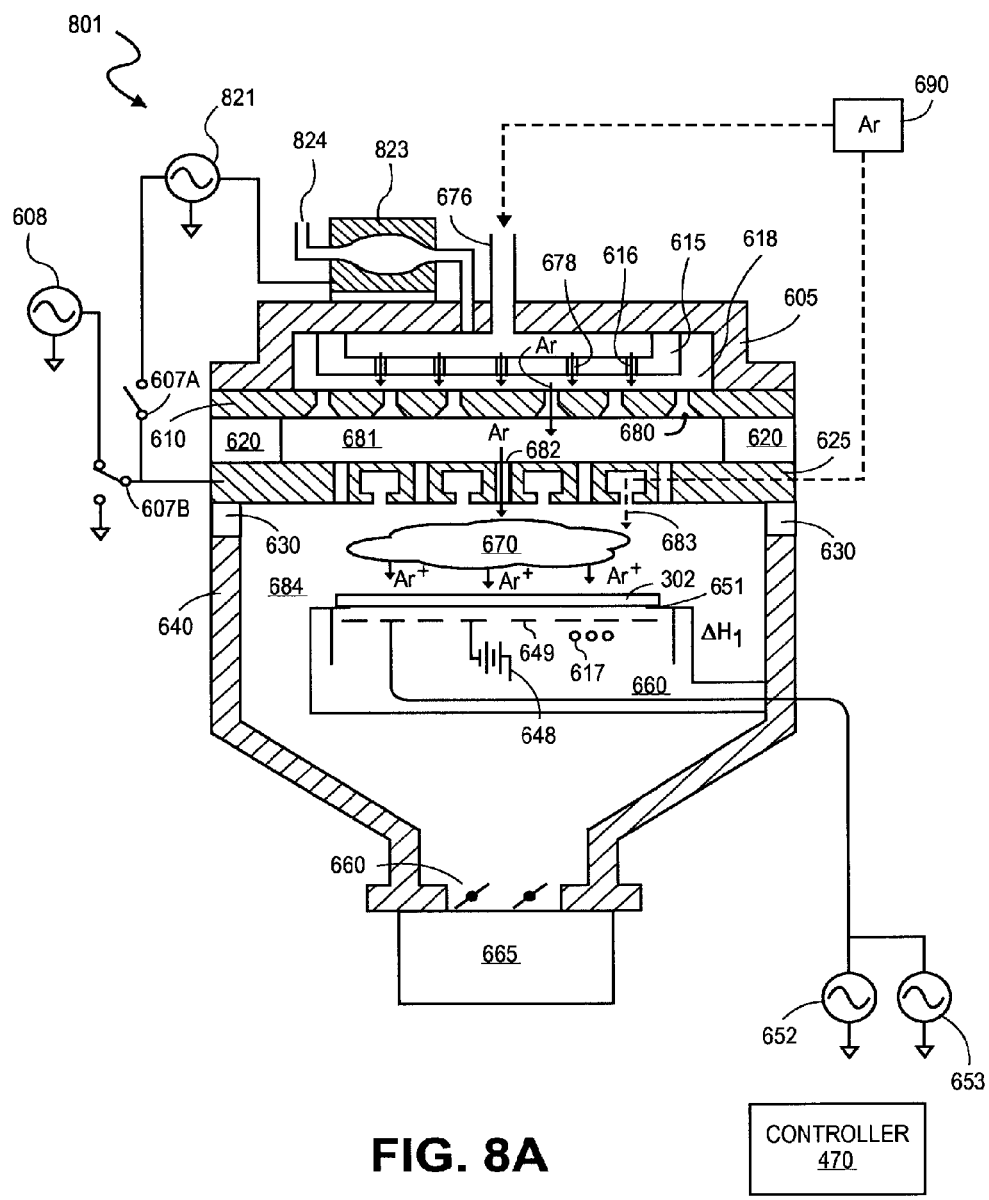
FIG. 8A illustrates a cross-sectional view of an etch chamber configured to perform the modification operation of the etch process illustrated in FIG. 1, in accordance with an embodiment.

FIG. 8A illustrates a cross-sectional view of an etch chamber 801 configured to perform the modification operation 110 of the etch process illustrated in FIG. 1, in accordance with an embodiment. Generally, the etch chamber 801 comprises a first capacitively coupled plasma source to implement the ion milling operation, a remote plasma source to implement the etching operation, and optionally a second capacitively coupled plasma source to implement the deposition operation.

The etch chamber 801 includes a remote RF plasma source 823 disposed above the first showerhead 625, opposite the chuck 660. In the ion milling mode of operation, the etch chamber 801 provides a capacitively coupled first plasma 670 within the first chamber region 684 substantially as described for the etch chamber 601. In the illustrated embodiment, the chuck 660 is coupled to a first RF power source (RF generators 652, and 653), and the first showerhead 625 is selectably coupled, through relay 607B, to ground or a second RF power source comprising one or more RF generators 608 operable at a frequency other than that of the first RF power source 652, 653. Where the first showerhead 625 is powered, the first showerhead 625 is isolated from a grounded chamber wall 640 by the dielectric spacer 630 so as to be electrically floating relative to the chamber wall 640. For embodiments, wherein the first showerhead 625 is powered, the second showerhead 610 and secondary electrode 605 may be electrically tied to the same potential as the first showerhead 625.

Figure 8B:
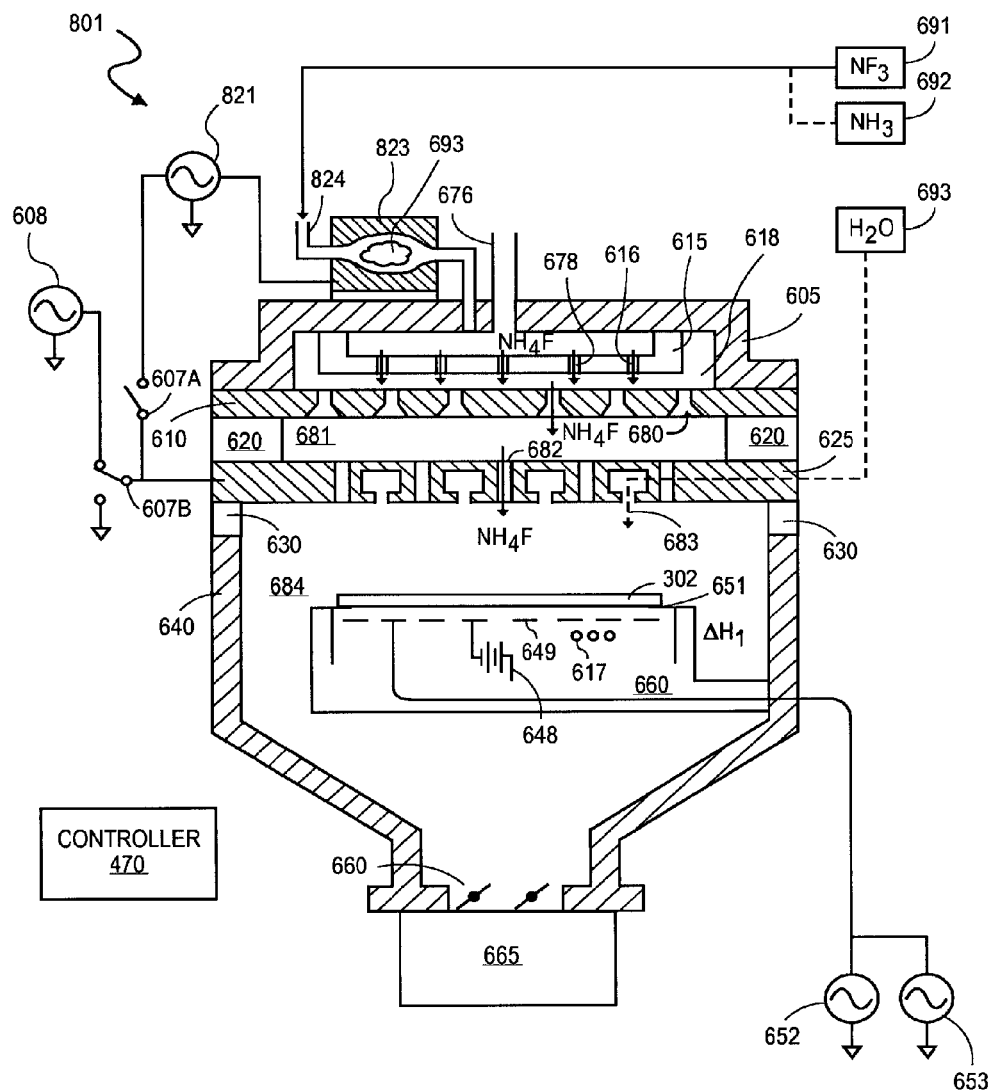
FIG. 8B illustrates a cross-sectional view of an etch chamber configured to perform the etching operation of the etch process illustrated in FIG. 1, in accordance with an embodiment.

FIG. 8B illustrates a cross-sectional view of the etch chamber 801 reconfigured from that shown in FIG. 8A to perform the etching operation 120 illustrated in FIG. 1, in accordance with an embodiment. As shown in FIG. 8B, in the etching mode of operation, the remote RF plasma source 823 is to discharge a second plasma 693 of a second feed gas provided through the gas inlet 824. In one exemplary embodiment, the remote RF plasma source 823 and the first showerhead 625 are both coupled to a same RF power source 821 through a relay 607A controllable by the controller to alternately power the first plasma 670 and the remote plasma 693. The remote plasma 693 is to be generated without placing a significant RF bias potential on the chuck 660. In a preferred embodiment, the first showerhead 625 is grounded or floating. Second feed gases sources 691,692 ($NF_3$, $NH_3$) are coupled to the gas inlet 824 with reactive species (e.g., $NH_4F$) then flowing through the first showerhead 625. Additional flow distribution may be provided with the second showerhead 610 and/or flow distributor 615, as described elsewhere herein. In an embodiment where the first showerhead 625 includes a DZSH, water vapor 693 may be provided through the apertures 683 to react with reactive species entering the first chamber region 684 through the apertures 682.

Figure 8C:
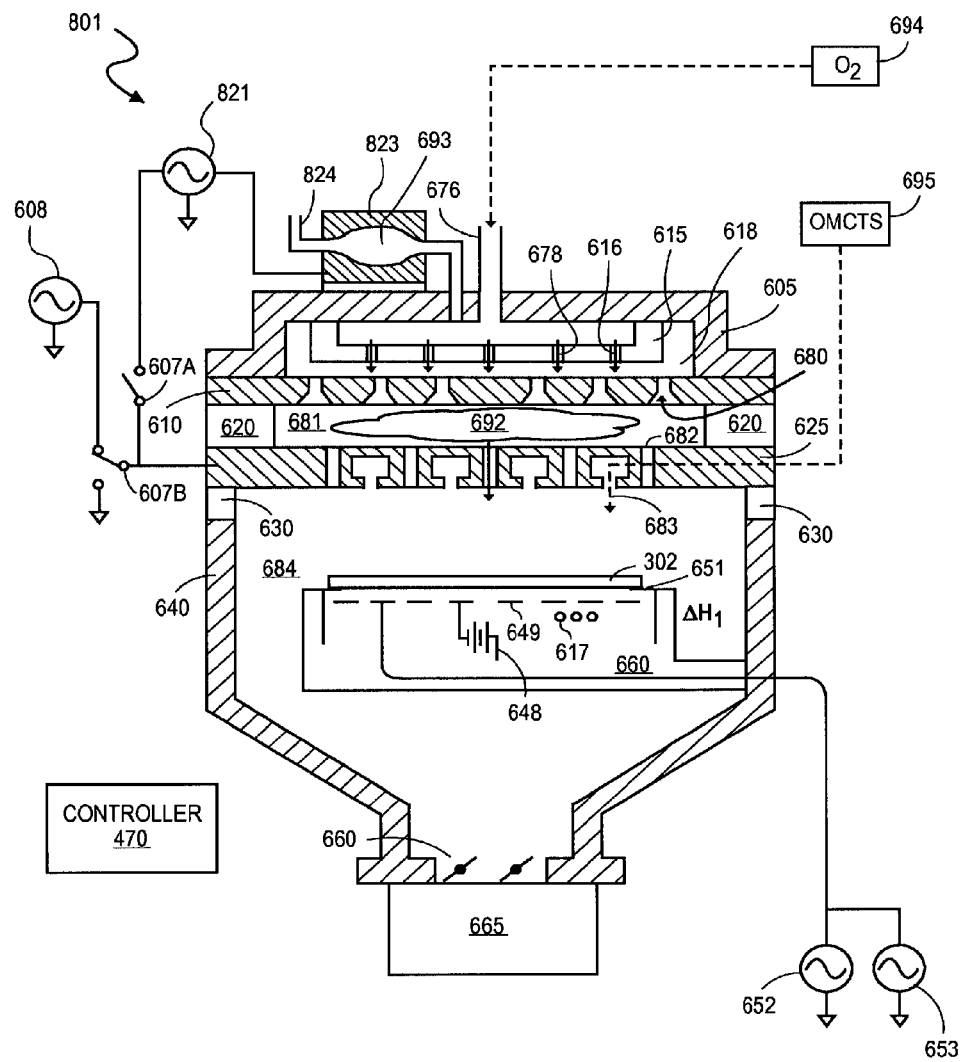
FIG. 8C illustrates a cross-sectional view of an etch chamber configured to perform the deposition operation of the etch process illustrated in FIG. 1, in accordance with an embodiment.

FIG. 8C illustrates a cross-sectional view of the etch chamber 801 reconfigured from the states illustrated in FIGS. 8A and 8B to perform the deposition operation 130 illustrated in FIG. 1, in accordance with an embodiment. As shown in FIG. 8C, while in the deposition operational mode, the chuck 660 is coupled to a first RF power source comprising one or more RF generators 652, 653 which may be left unpowered (e.g., floating). The first showerhead 625 is coupled to a second RF power source comprising one or more RF generators 608 that may be at a frequency other than that of the RF generator 652 (e.g., 13.56 MHz). With the first showerhead 625 isolated from a grounded chamber wall 640 by the dielectric spacer 630 and further isolated from the second showerhead 610 by the dielectric spacer 620, RF power to the first showerhead 625 is to generate a third plasma 692 (e.g., of an oxidizing source gas such as $O_2$ 694) in the second chamber region 681. In one exemplary embodiment, the first showerhead 625 and the remote RF plasma source 823 are both coupled to a same RF power source 821 through a relay 607A controllable by the controller 470 to alternately power the third plasma 692 and the remote plasma 693 between etch and deposition (e.g., operations 120 and 130 in FIG. 1, respectively).

The controller 470 is to alternately energize the first plasma 670 and remote plasma 693 during the etching process by alternately powering the two sources automatically. The controller 470 may similarly place the chamber 801 into the deposition mode.

Figure 9A:
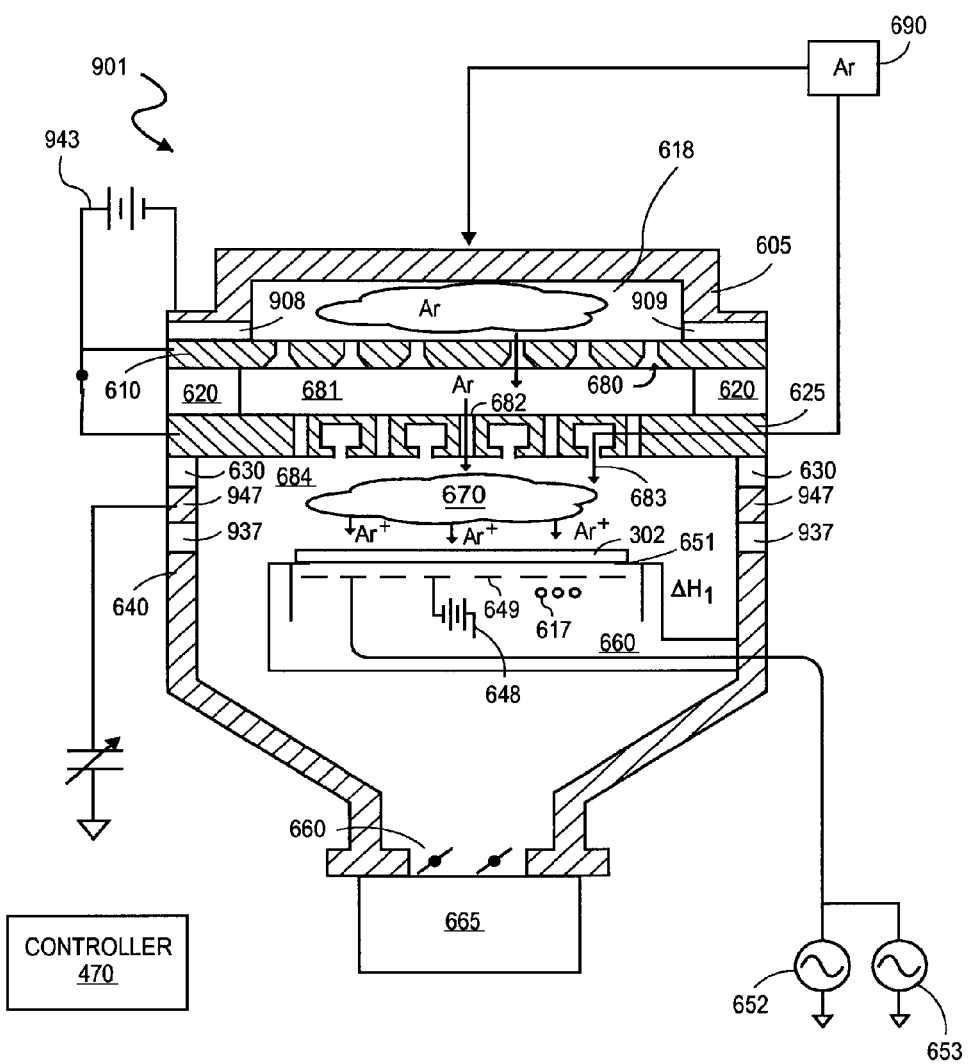
FIG. 9A illustrates a cross-sectional view of an etch chamber configured to perform the modification operation of the etch process illustrated in FIG. 1, in accordance with an embodiment.

FIG. 9A illustrates a cross-sectional view of an etch chamber 901 configured to perform the modification operation 110 illustrated in FIG. 1, in accordance with an embodiment. Generally, the etch chamber 901 comprises a capacitively coupled plasma source to implement the ion milling operations and e-beam source to implement the etching operation and to implement the optional deposition operation. As shown in FIG. 9A, a capacitive discharge is provided substantially as described elsewhere herein with the first showerhead 625 disposed above the chuck 650 to distribute a first feed gas 690 into the first chamber region 684. The chuck 660 and the first showerhead 625 form a first RF coupled electrode pair to capacitively discharge the RF plasma 670 of the first feed gas (e.g., Ar).

Figure 9B:
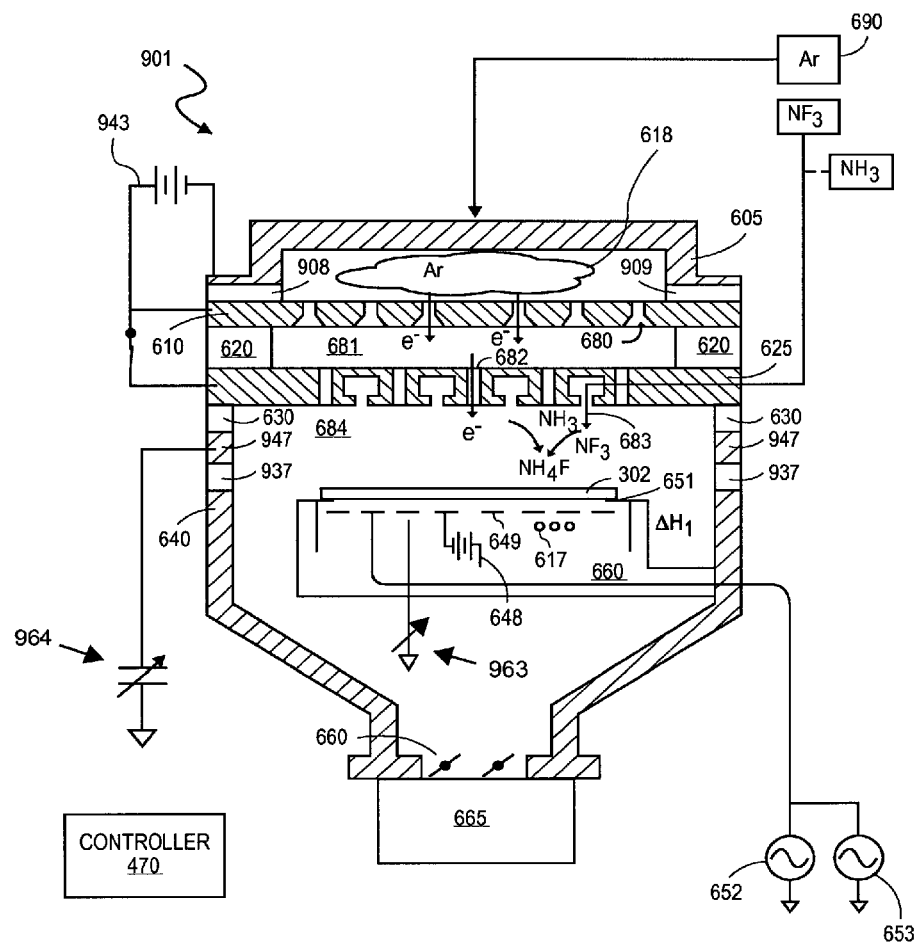
FIG. 9B illustrates a cross-sectional view of an etch chamber configured to perform the etching operation of the etch process illustrated in FIG. 1, in accordance with an embodiment.

FIG. 9B illustrates a cross-sectional view of the etch chamber 901 reconfigured to perform the etching operation 120 illustrated in FIG. 1, in accordance with an embodiment. As shown, a high voltage DC supply 943 is coupled to the secondary electrode 605 and the second showerhead 610 to form a pair of DC electrodes disposed above the first showerhead 625 to generate a DC glow discharge 618 in the chamber region between the DC electrodes. The pair of DC electrodes are electrically insulated from the first showerhead 625 by the dielectric spacer 620. The first showerhead 625 is further isolated from the chamber wall 640 by the dielectric spacer 630 to permit control of the first showerhead 625.

During operation, the secondary electrode 605 is biased at a cathodic DC potential, for example 4-8 kV while the second showerhead 610 is biased at an anodic potential (e.g., −100V to −200 V). Electrons from the DC glow discharge 618 generated from a first feed gas (e.g., Ar bottle 690) pass through apertures 680 in into the second chamber region 681. The first showerhead 625 is also coupled to a DC supply, for example to the second showerhead 610 via a relay, to be biased negatively to an anodic potential relative to the cathodic potential of the secondary electrode 605. The negative bias on the first showerhead 625 allows electrons to pass through the first showerhead 625 and into the first chamber region 684. The first showerhead 625 may have large holes for to further advance this purpose. In this manner, an "e-beam" source is a means to softly ionize a feed gas (e.g., $NF_3$ and $NH_3$ provided by aperture 683 in a DZSH embodiment) in the first chamber region 684 to provide a reactive etching species (e.g., $NH_4F$, etc.) without significant bias on the workpiece 302.

As further depicted in FIG. 9B, while the chuck 660 is coupled to an RF source (generators 652 and 653) during an ion milling mode, the chuck 660 may also be maintained at ground potential or a cathodic potential during either or both the etching and deposition operations. A controllable, variable chuck potential 963 is provided between ground potential and a positive bias to control electron flux from the DC glow discharge 618 to the workpiece 302. In a further embodiment, the etch chamber 901 includes a thief electrode 947 disposed between the first showerhead 625 and the chuck 660. The thief electrode 947 is coupled to ground through a variable capacitor 964 to further control electron flux to the workpiece 305. As shown, the thief electrode 947 is a conductive ring isolated from the first showerhead 625 by a first dielectric spacer 630 and isolated from the grounded chamber wall 640 by a second dielectric spacer 937.

Figure 9C:
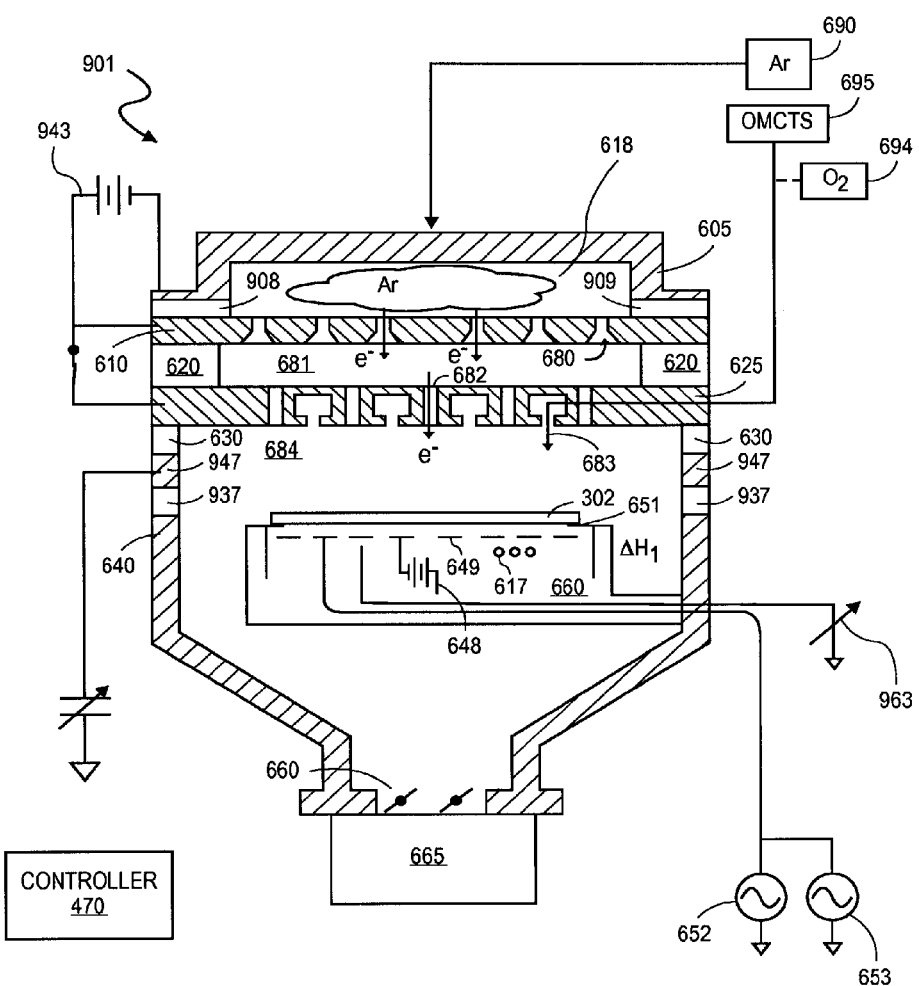
FIG. 9C illustrates a cross-sectional view of an etch chamber configured to perform the deposition operation of the etch process illustrated in FIG. 1, in accordance with an embodiment.

FIG. 9C illustrates a cross-sectional view of the etch chamber 901 reconfigured to perform the deposition operation 130 illustrated in FIG. 1, in accordance with an embodiment. Either the DC source employed for the etching operation 120 or a second RF plasma generated in the second chamber region 681, substantially as described elsewhere herein, is employed to perform a PECVD deposition of the protection layer. Where the DC source is utilized, electrons emanating from the second showerhead 610 pass through the first showerhead 625 and a silicon-containing precursor, such as OMCTS 695 is provided via the apertures 683. Oxygen may also be supplied by the apertures 683 to be ionized by the electron flux.

The controller 470 is to alternately energize the first plasma 670 and DC glow discharge 618 during the etching process by alternately powering the two sources automatically. The controller 470 may similarly place the chamber 901 into the deposition mode.

In a further embodiment, in-situ cure of the deposited protection layer may be performed with the electron flux, essentially performing an e-beam cure-type process. The controllable, variable chuck potential 963 provided between ground potential and a positive bias may control electron flux from the DC glow discharge 618 to the workpiece 302 for this purpose as well. Specifically, where curing is desired, the workpiece 302 is to be placed at ground potential and where curing is not desired, the workpiece 302 is to be placed at a cathodic potential.

Figure 10:
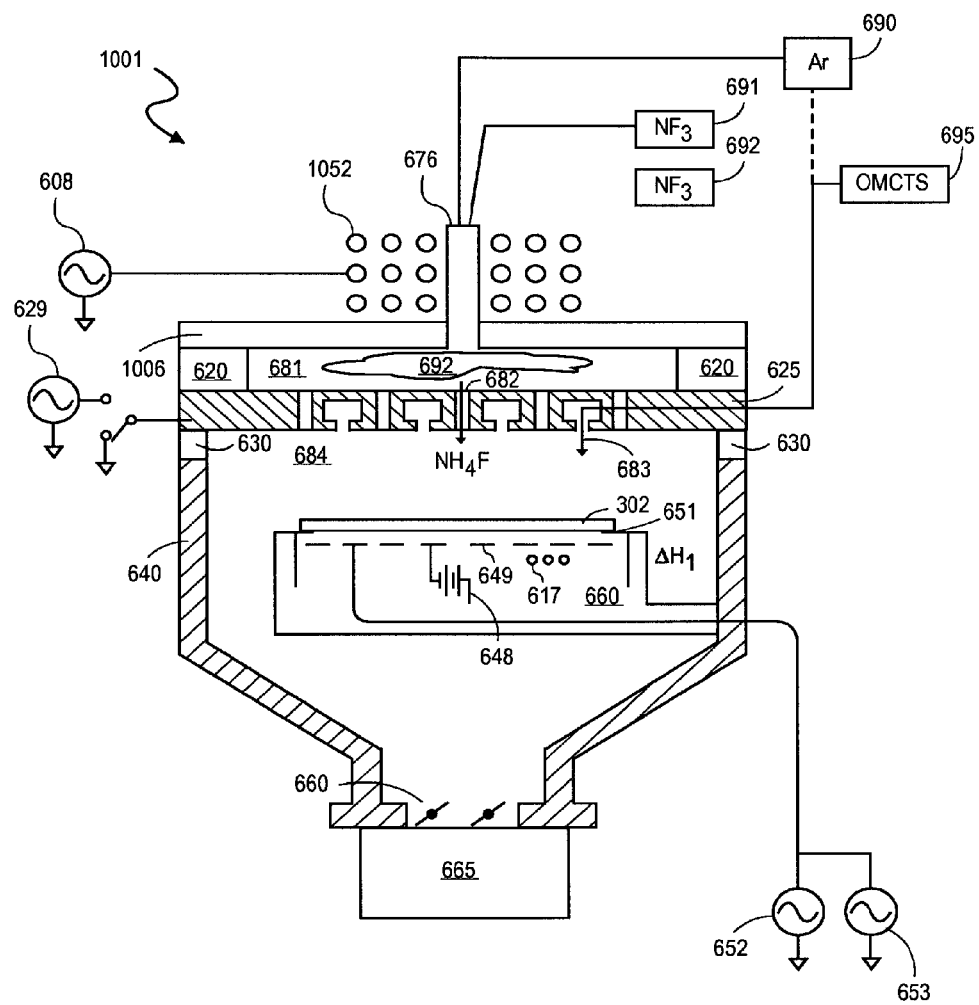
FIG. 10 illustrates a cross-sectional view of an etch chamber configured to perform the various operations illustrated in FIG. 1, in accordance with an embodiment.

FIG. 10 illustrates a cross-sectional view of an etch chamber 1001 configured to perform the various modes of the etch process 100 illustrated in FIG. 1, in accordance with an embodiment. Generally, the etch chamber 1001 comprises a CCP to implement the ion milling operations and inductively coupled plasma source (IPS) to implement the etching operation and to implement the optional deposition operation.

As shown in FIG. 10, all the chamber components previously described in the context of the CCP plasma for the modification operation 110 (FIG. 1) in the first chamber region 684 are provided, again with the chuck 660 and the first showerhead 625 forming an RF electrode pair. In an embodiment the first showerhead 625 is a DZSH that may be powered, electrically floating, or grounded substantially as described elsewhere herein. For the etch operation (e.g., 120 in FIG. 1), the set of conductive coils 1052 are coupled to an RF source including the generator 608, to generate an inductively coupled plasma 692 in any manner known in the art. The ICP source in combination with the large size holes in DZSH embodiments of the first showerhead enable efficient ionization of feed gas, such as $NF_3$ 691 and $NH_3$ 692, introduced through the dielectric lid 1006.

The controller 470 is to alternately energize the first plasma 670 and ICP plasma 692 during the etching process by alternately powering the two sources automatically. The controller 470 may similarly place the chamber 1001 into a deposition mode.

It is to be understood that the above description is intended to be illustrative, and not restrictive. Furthermore, many embodiments other than those described in detail will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of etching a dielectric film, the method comprising:
    loading a workpiece into an etch chamber;
    modifying a top thickness of the dielectric film disposed on the workpiece by bombarding the workpiece with a low energy flux of non-reactive ions from a capacitively coupled plasma of a first source gas energized within a first chamber region, wherein the first chamber region is between a chuck supporting the workpiece and a first showerhead;
    etching the modified top thickness of the dielectric film selectively over the dielectric film disposed under the top thickness by exposing the workpiece to a reactive species generated by a plasma of a second source gas energized in a second chamber region, wherein the second chamber region is disposed above the showerhead, opposite the chuck;
    cyclically repeating both the modifying and etching until an etch process termination criteria is met; and
    unloading the workpiece from the etch chamber.

2. The method of claim 1, wherein the dielectric film comprises carbon and wherein the modifying comprises reducing the carbon content within the top thickness of the dielectric film.

3. The method of claim 1, wherein the capacitive coupled plasma is generated by driving the chuck with an RF source to provide the workpiece with an RF bias potential.

4. The method of claim 3, wherein the plasma of the second source gas comprises a capacitive RF discharge, a DC discharge, or an inductive RF discharge.

5. The method of claim 1, further comprising depositing a protection layer on an etched sidewall of the dielectric film by generating a oxidizing plasma from of a third source gas within the second chamber region and reacting a silicon-containing precursor with a reactive species from the oxidizing plasma within the first chamber region.

6. The method of claim 5, wherein depositing the protection layer further comprises depositing a carbon-doped silicon oxide on the workpiece periodically after a predetermined number of modifying and etching cycles.

7. The method of claim 1, wherein the first source gas includes at least one of argon, neon, xenon, helium, and wherein the second source gas comprises at least $NF_3$ and a hydrogen source.

8. The method of claim 4, wherein the workpiece is controlled to a predetermined elevated temperature of at least 80° C. during the etching.

9. The method of claim 8, wherein the workpiece is maintained at the predetermined elevated temperature during the entire etch process.

10. The method of claim 1 wherein the dielectric film comprises a low-k dielectric.

11. The method of claim 1 wherein the plasma of the first source gas is anisotropic for ion milling and wherein the plasma of the second source gas is isotropic for etching.

12. A method of etching, the method comprising:
    loading a workpiece onto a chuck in an etch chamber, the workpiece having a dielectric film disposed thereon;
    modifying a top thickness of the dielectric film disposed on the workpiece with a first plasma formed within a first chamber region to form a modified surface of the dielectric film on a non-modified portion of the dielectric film, wherein the first chamber region is between the chuck and a first showerhead;
    etching the modified surface of the dielectric film selectively over the non-modified portion of the dielectric film with a second plasma formed in a second chamber region, wherein the second chamber region is disposed above the showerhead, opposite the chuck;
    cyclically repeating both the modifying and etching; and
    unloading the workpiece from the etch chamber.

13. The method of claim 12, wherein the dielectric film comprises carbon and wherein the modifying comprises reducing the carbon content within the top thickness of the dielectric film.

14. The method of claim 12, further comprising depositing a protection layer on an etched sidewall of the dielectric film.

15. The method of claim 14, wherein depositing the protection layer further comprises depositing a carbon-doped silicon oxide on the workpiece periodically after a predetermined number of modifying and etching cycles.

16. The method of claim 12, wherein the workpiece is controlled to a predetermined elevated temperature of at least 80° C. during the etching.

17. The method of claim 16, wherein the workpiece is maintained at the predetermined elevated temperature during the entire etch process.

18. The method of claim 12 wherein the dielectric film comprises a low-k dielectric.

* * * * *